(12) United States Patent
Smith et al.

(10) Patent No.: US 6,566,873 B1
(45) Date of Patent: May 20, 2003

(54) METHOD OF AND APPARATUS FOR NUCLEAR QUADRUPOLE RESONANCE TESTING A SAMPLE

(75) Inventors: John Alec Sydney Smith, London (GB); Neil Francis Peirson, Northampton (GB)

(73) Assignee: BTG International Limited, London (GB)

( * ) Notice: Subject to any disclaimer, the term of this patent is extended or adjusted under 35 U.S.C. 154(b) by 0 days.

(21) Appl. No.: 09/257,916

(22) Filed: Feb. 26, 1999

(30) Foreign Application Priority Data

Aug. 28, 1996 (GB) .............................. 9617976

(51) Int. Cl.[7] .............................................. G01V 3/00
(52) U.S. Cl. ...................................... 324/300; 324/314
(58) Field of Search .............................. 324/300, 314, 324/306, 307, 309, 312, 318, 322

(56) References Cited

U.S. PATENT DOCUMENTS

| | | | |
|---|---|---|---|
| 5,229,722 A | | 7/1993 | Rommel et al. |
| 5,457,385 A | * | 10/1995 | Sydney et al. .............. 324/300 |
| 5,608,321 A | | 3/1997 | Garroway et al. |
| 5,719,499 A | * | 2/1998 | Chandrakumar ............ 324/300 |

FOREIGN PATENT DOCUMENTS

| | | |
|---|---|---|
| EP | 329 402 | 8/1989 |
| GB | 2 246 636 | 2/1992 |
| GB | 2 257 525 | 1/1993 |
| GB | 2 284 898 | 6/1995 |
| WO | WO 92/17794 | 10/1992 |
| WO | WO 92/21989 | 12/1992 |
| WO | WO 96/26453 | 8/1996 |
| WO | WO 97/03366 | 1/1997 |

OTHER PUBLICATIONS

Ermakov et al., "Toggling–frame NQR imaging", Applied Magnetic Resonance, 1992, Austria, vol. 3, No. 6.
Nickel et al., Two–dimensional projection/reconstruction rotating–fram NQR imaging (ρNQRI), Chemical Physics Letters, vol. 183, No. 3.4, Aug. 30, 1991, pp. 183–186.
LEHNINGER: "Principles of Bio Chemistry –The Thyroid Hormones Control Metabolic Rate"; SOME ASPECTS OF HUMAN BIOCHEMISTRY; 1982, pp. 742–743.; published by Worth Publishers Inc., editor: ANDERSON.
P. Nickel, E. Rommel, R. Kimmich, and D. Pusiol; Two–dimensional Projection/Reconstruction Rotating–frame NQR Imaging (pNQRI); Chemical Physics Letters; Aug. 30, 1991; pp. 183–186; vol. 183, No. 3, 4.
Osokin: "Pulsed Spin Locking in Nuclear Quadrupole Resonance of[14]N"; SOV, PHYS. JETP 57 (1), Jan. 1983; pp. 69–71.

(List continued on next page.)

*Primary Examiner*—Louis Arana
(74) *Attorney, Agent, or Firm*—Pillsbury Winthrop LLP

(57) ABSTRACT

A method of nuclear quadrupole resonance testing a sample is disclosed in which the excitation applied to the sample is arranged so that phase and amplitude information may be obtained from the response signal, and in which the signal is resolved into two components. Particularly if a parameter such as radio-frequency field strength varies with position, this may give an indication of the distribution of nuclei in the sample, preferably from the phase of the response signal. Positional information can also be obtained by measuring from two or more reference points. This may be employed in imaging. The phase information may be employed to improve the signal to noise ratio obtainable in other methods where only amplitude information was previously available, for example in distinguishing genuine NQR response signals from spurious signals.

46 Claims, 22 Drawing Sheets

OTHER PUBLICATIONS

Ermakov et al: "Echo in the Effective Field of a Multi–Pulse NQR–Sequence"; Journal of Experimental & Theoretical Physics (JETF), vol. 54, issue 8, Oct. 25, 1991; pp. 464–468.

Osokin et al: "Multiple Echos in the Effective Field of Multipulse Trains in Nuclear Quadrupole Resonance"; JEPT Lett. vol. 62, No. 4; Aug. 25, 1995; pp. 309–313.

Robert et al: "On the Reconstruction of NQR Nutation Spectra in Solids with Powder Geometry"; Z. Naturfosch; 49a; 1994; pp. 35–41.

Rommel et al: "Spectroscopic Rotating–Frame NQR Imaging (ρNQRI) using Surface Coils"; MEAS. SCI. TECHNOL. 2, (1991) pp. 866–871.

W.B. Saunders: "Medical Physiology"; Endocrinology and Reproduction; 1981; pp. 932 –935.

W.B. Saunders: "Clinical Chemistry"; Thyroid Endocrinology; 1993; pp. 496 –509.

Lynch et al: "Oral Medicine"; Diagnostic Laboratory Procedures; 1984; pp. 100–102.

Biochemicals Organic Compounds/Diagnostic Reagents; 1991; 2 pp. 971 & 993.

Rommel et al: Two–Dimensional Exchange Spectroscopy using Pure NQR*; Z. Naturforsch; 47a; (1992); pp. 382–388.

* cited by examiner

METHOD OF AND APPARATUS FOR NUCLEAR QUADRUPOLE RESONANCE TESTING A SAMPLE

The present invention relates to a method of and apparatus for nuclear quadrupole resonance testing a sample, and is applicable in one aspect to imaging a sample based on its nuclear quadrupole resonance (NQR) response. The invention has particular application to the detection of the presence of a given substance in a sample, and more particularly to the determination of the position and/or amount of material.

Nuclear Magnetic Resonance (NMR) techniques are now widely used for imaging, particularly medical imaging, e.g. using proton resonance. However, NMR investigations require a strong and highly homogeneous static magnetic field to operate, and this requires bulky and expensive equipment. In addition, due to the strong magnetic field, the method cannot be used in the presence of ferrous objects.

Nuclear quadrupole resonance (NQR) responses can be detected without requiring the presence of a strong static magnetic field, and so interest in using the NQR response of a body to probe its structure has recently developed. However, because NQR is a different phenomenon to NMR, existing NMR techniques cannot be directly applied to NQR investigations.

NQR testing has been increasingly widely used for detecting the presence or disposition of specific substances. The phenomenon depends on transitions between energy levels of quadrupolar nuclei, which have a spin quantum number I greater than or equal to 1, of which $^{14}N$ is an example (I=1). $^{14}N$ nuclei are present in a wide range of substances, including animal tissue, bone, food stuffs, explosives and drugs. The basic techniques of NQR testing are well-known and are discussed in numerous references and journals, so will only be mentioned briefly herein.

In conventional Nuclear Quadrupole Resonance testing a sample is placed within or near to a radio-frequency (r.f.) coil and is irradiated with pulses or sequences of pulses of electro-magnetic radiation having a frequency which is at or very close to a resonance frequency of the quadrupolar nuclei in a substance which is to be detected. If the substance is present, the irradiant energy will generate an oscillating magnetization which can induce voltage signals in a coil surrounding the sample at the resonance frequency or frequencies and which can hence be detected as a free induction decay (f.i.d.) during a decay period after each pulse or as an echo after two or more pulses. These signals decay at a rate which depends on the time constants $T_2^*$ for the f.i.d., $T_2$ and $T_{2e}$ for the echo amplitude as a function of pulse separation, and $T_1$ for the recovery of the original signal after the conclusion of the pulse or pulse sequence.

The present invention, in one aspect, is particularly concerned with probing a sample to obtain information dependent on the position or distribution of resonant nuclei within a sample. This may be used to produce an image of the sample.

It is known that the NQR response of nuclei in a crystal is dependent on the environment of the nuclei, and also on factors such as the strength of the exciting field. If the exciting radio-frequency (r.f.) field strength varies throughout the sample, then the resonance response will also be dependent on position within the sample, and this can in principle be used to give an indication of the position of resonant nuclei within a sample.

A method for obtaining positional information using NQR, employing an r.f. field gradient, and not requiring a static magnetic field, has been proposed by Rommel, Kimmich et al. (Journal of Magnetic Resonance 91, 630–636 (1991) and also U.S. Pat. No. 5,229,722). Those disclosures (see page 631, line 25 of the paper and column 6, lines 46–50 of the patent) teach that NMR techniques such as phase-encoding (in which both the phase and the amplitude of the r.f. signal received from the sample are used to obtain information about the sample) cannot be applied to NQR imaging, and that only amplitude encoding is possible with NQR imaging. In other words, it is stated that it is only possible to extract a single parameter (signal amplitude) from an NQR imaging experiment which uses an r.f. field gradient in the absence of a static magnetic field. This is stated to be consistent with the theory that the transverse magnetisation associated with an NQR response oscillates, in contrast to the precession about the applied magnetic field observed in an NMR experiment.

Our earlier United Kingdom Patent Number GB-2,257,525 discloses a method of imaging using NQR in which a field gradient is imposed upon a sample. Reference should be made to that disclosure for useful background information and further discussion of the art of imaging using NQR which is not repeated here. In that patent, surprisingly advantageous results were obtained by subjecting a sample to a field having a particular positional dependence. Although that method can enable a satisfactory image to be obtained, there is still some room for improvement.

The present invention seeks to provide a method and apparatus for probing a sample by detecting its NQR response which alleviates some or all of the drawbacks of previous methods. Preferred arrangements disclose a probing technique in which positional information may be obtained even in the absence of a controlled static magnetic field.

The invention is applicable to detection of quadrupolar nuclei (I≧1) and is particularly applicable to nuclei such as $^{14}N$ (I=1) in which advantageous results can readily be obtained in the absence of a static magnetic field, but may be used for detecting other quadrupolar nuclei, for example I=3/2, I=5/2 etc. The invention is particularly applicable to polycrystalline samples, or samples containing one or more polycrystalline clusters of quadrupolar nuclei.

In developing the invention, it has been appreciated that there are many NQR applications in addition to imaging in which it would be desirable to obtain more information than signal amplitude, but this has hitherto not been possible from a single measurement.

Surprisingly, the inventors have found that two independently varying components (e.g. phase and amplitude dependent components) can be extracted from a received NQR response signal if the excitation is selected appropriately. A preferred method of achieving this is to use two excitation pulses of selected phase. This can lead to a more reliable classification of the object under test.

The prior art has not reported detection of two independently resolvable components resulting from NQR interactions. Indeed, theory predicts only a single component is to be found, and Rommel et al. states that phase encoding is not possible in NQR experiments.

The phase and amplitude dependent components may actually be phase and amplitude, but it is to be understood that references herein to phase and amplitude dependent components are intended to include components derived from or related to the phase and amplitude of the response signal without necessarily being directly representative thereof. In particular, the signal may be resolved into two components, both of which vary as functions of both phase and amplitude. For example, in a preferred arrangement, the received signal is (initially) resolved into two components having a quadrature relationship. Phase-related information may be obtained by combining the two components in a first manner (e.g. comprising determining a ratio of the components) and amplitude-related information may be obtained by combining the components in a second manner (e.g. comprising summing a function of the components).

The extra information obtainable by the provision of both phase and amplitude information in an NQR experiment may be useful in a number of ways, as will be understood by one skilled in the art based on the discussion below.

In an imaging experiment, the provision of both phase and amplitude information can provide better classification of the sample than the amplitude encoding alone technique of Rommel et al. where the received signal amplitude is dependent on both the position (as intended in the experiment) and also on the amount of resonant material present. This can alleviate one problem of Rommel's technique that unless the amount of resonant material is known, it may not be possible to determine its position accurately, and vice versa.

The phase and amplitude information may be used together to improve signal to noise ratio in any of a number of experiments where only amplitude information was previously available.

Thus, based on the results of the above surprising finding, the invention provides, in one aspect, a method for nuclear quadrupole resonance testing a sample containing quadrupolar nuclei, comprising applying excitation to the sample, the excitation being selected to produce a response signal containing detectable phase and amplitude components resulting from nuclear quadrupole resonance interaction between said excitation and said quadrupolar nuclei, detecting the response signal, resolving the response signal into (independently variable) phase and amplitude dependent components and processing the response signal on the basis of both components.

In this specification, references to processing the response signal on the basis of both components are preferably intended to imply processing the response signal as if it were a function of two independent variables (phase and amplitude), and in particular may include resolving the response signal into two independent quantities (e.g. phase and amplitude). This is to be contrasted with processing (for example in which a phase sensitive detector may be employed to detect signals of a particular phase) in which phase information is not measured as an independently varying quantity.

Preferably a plurality of values of the response signal are sampled (preferably for different excitation conditions e.g. pulse lengths) and a plurality of values of a phase parameter (e.g. phase or the ratio of real and imaginary components) varying as a function of the phase of the response signal substantially independently of the response signal amplitude are determined. Determination of variation of a phase parameter (preferably in addition to determination of an amplitude parameter) for several values of the response signal may enable useful information, e.g. positional information or information useful in noise reduction to be gained from the response signal.

According to a preferred arrangement, the excitation comprises first and second pulses differing in phase by a predetermined angle. This can provide a convenient method of exciting the desired response in a predictable manner.

The angle is preferably about 90° as this may enable two substantially independent components to be resolved.

The two pulses are preferably transmitted from the same coil (or coils); this may provide convenience and ease of establishing phase correlation between the pulses.

The pulses may be separated by a time period, which is preferably relatively short, e.g. substantially shorter than the f.i.d. (Free-induction decay) time, $T_2^*$, and preferably zero or as close to zero as possible; that is, the pulses are preferably contiguous. A composite pulse is preferred, the first and second pulses being substantially contiguous but differing in phase; this may shorten overall measurement times, and may improve response signal amplitudes.

In a preferred arrangement, the excitation comprises two pulses of substantially equal duration, but different phase. Use of pulses of equal duration may simplify calculation of position (where position is determined) of the responsive material or other processing of the data. However, if the durations differ, and preferably if the response signal is determined for a plurality of different relative durations, this may be useful in obtaining a more precise determination of the position of a responsive substance in a sample.

The pulses are preferably of substantially equal amplitude; this simplifies the equipment needed and may simplify processing of the data.

It is particularly advantageous if the second pulse is arranged (at least partially) to lock the magnetisation (of the quadrupolar nuclei) generated by the first pulse. Such a sequence may be termed a "spin locking" sequence, with the magnetization being locked for a time longer than would be achievable with the equivalent single pulse. Locking can be achieved by keeping the $B_1$ field of the second pulse parallel to the magnetization produced by the first pulse. This may enable a stronger and longer lasting signal attributable to the first pulse to be detected.

Preferably also, the excitation includes a third pulse selected to lock (at least partially) the net magnetization produced by the first two pulses, and preferably being of phase intermediate that of the first and second pulses. This can further assist in locking the magnetization, and may result in a higher signal to noise ratio or better interference suppression. It may also be useful in selecting components of a particular phase, and this may be useful in selecting signals emanating from a particular region of the sample. This may also be provided as a further independent aspect, in a method of detecting NQR response signals emanating from quadrupolar nuclei in a given region of a sample, the method comprising exciting the sample to produce a response signal from the quadrupolar nuclei having a phase varying as a function of the position of the nuclei and identifying signals of a given phase, wherein said identifying preferably comprises applying a pulse arranged to lock response signals of said given phase.

Although reference is made above to a single series of two or three pulses, it will be understood that several series of excitation pulses may be used, and signals detected after excitation with some or all of said series. For example, a series of pulses may be used to lock spins. This may be useful in reducing interference or spurious signals due to other objects (e.g. metallic objects, particularly nickel plated objects) within a sample.

It will be understood that references in the present specification to phases differing or being equal is equivalent in certain circumstances to references to frequency differing or being equal, in that a change in phase implies an at least momentary change in frequency and vice versa.

In one practical arrangement, a phase-sensitive detector may be employed to detect the phase and amplitude dependent components as two components having a predetermined phase relationship, most preferably a quadrature phase relationship. This may provide a convenient way of detecting two components in the signal. With this arrangement, the first and second components may correspond to the components along the x and y axis of the rotating frame, and in what follows these will be referred to as the real and imaginary components of the received signal.

Preferably a parameter varying as a function of phase is obtained from a ratio of the two components. This may enable simple but effective determination of a phase parameter.

Most preferably, at least the field strength of the excitation varies throughout at least a portion of the sample according to a given pattern. This is similar to the case with surface coils, well-known in magnetic resonance imaging, and provides a readily implementable way of providing a response signal which encodes or conveys information concerning the distribution or position of responsive nuclei in the sample to be obtained. In a preferred arrangement for achieving this, the excitation pulses are transmitted to the sample from a coil which produces a non-uniform r.f. field in the vicinity of the sample. The r.f. field amplitude preferably varies with position in a known manner.

In a preferred arrangement, the field strength and duration are selected to produce a variation of flip angles within a range of 0 to $2\pi$ (360 degrees) throughout a region of interest of the sample, and preferably throughout the sample. The minimum usable flip angle will depend on noise and other considerations, but in some cases may be of the order of a few degrees. Preferably the maximum flip angle in the sample (or at least the region of interest) does not exceed $2\pi$. Keeping all flip angles below $2\pi$ may allow the measured phase to be a single-valued function of position, which may simplify determination of position.

It will be appreciated by those skilled in the art that the flip angle for a given pulse duration and amplitude is dependent on I, the nuclear spin quantum number as well as on the gyromagnetic ratio; the spin quantum number I affects the order of the Bessel function which governs the variation of effective flip angle with pulse duration and amplitude. In this specification, a flip angle of $2\pi$ is intended to refer to a return of the magnetisation vector M into parallellism with its original orientation (which equates to a particular product of pulse amplitude and duration), and other flip angles are to be construed accordingly in proportion.

Preferably, position information representative of the position of said nuclei is obtained based on at least the phase of the response signal. Using phase (rather than amplitude alone) to determine position may enable positional determination to be substantially independent of the amount of responsive nuclei present. This may facilitate accurate determination with fewer measurements, for example in some cases a single measurement may suffice.

Preferably, quantity information representative of the amount of said nuclei is obtained based on at least the amplitude of the response signal, or based on the combined amplitude of two (preferably orthogonal) components into which the signal is resolved. This can be used in adjusting the results to take into account the amount of responsive nuclei, and, if combined with positional information, can allow a distribution of nuclei in the sample to be calculated.

Preferably, the received components are analysed to obtain profile information representative of the distribution of said nuclei in said sample. This may be useful in locating NQR responsive substances within a body, and may be developed to provide an image of the interior of the body.

The received components may be analysed to obtain profile information representative of variation of an environmental parameter, preferably temperature or pressure, which affects said NQR response in said sample. This may be useful in thermal or stress analysis.

Whilst both depth and position information can be obtained from the response to a single excitation (a composite pulse or pair of pulses) for a simple sample as discussed above, in an advantageous development, the excitation is applied repeatedly to the sample, and the analysis is repeated (preferably with at least one factor affecting the response varying as the excitation is repeated) to obtain a plurality of sets of said profile information. This may enable more accurate analysis of the sample, and preferably at least one further set of profile information of higher resolution and/or higher signal-to-noise ratio is obtained from said plurality of sets.

The factor is preferably at least one of excitation pulse duration and excitation field strength. This may provide an easily implementable method of optimising the excitation or obtaining multiple measurements.

For example, one or more of the pulse length and $B_1$ field may be varied in a number of steps over the range of flip angles selected, in which case the resolution will be determined by the number of steps in each experiment, the greater the number of steps, the greater the resolution.

The duration of the pulses may be varied, for example in a series of increments. This may be used to extend the measurable depth over which nuclei can be detected or to improve the resolution at which determination can be made or to resolve ambiguities resulting from analysis of data from a single measurement or to improve the signal to noise ratio.

The relative durations of the first and second pulses may be varied, and preferably the total duration of the two pulses is kept substantially constant. For example, a series of measurements may be made, ranging from a relatively short first pulse and long second pulse through substantially equal durations to a relatively long first pulse and short second pulse. This may be useful in distinguishing signals from a particular location more accurately.

The amplitude (field strength) of the exciting pulse may be varied. This is preferably in a series of discrete increments, but may be substantially continuous or quasi-continuous in certain cases. This may enable accurate resolution of position, or may enable uncertainties or degeneracies in the distribution to be resolved, and may be particularly useful in reducing noise which may be present when the sample is distant from the transmitter coil(s).

The method may include obtaining a plurality of sets of profile information, corresponding to profiles at different positions or in different directions. This may be used in further characterisation of the sample, or determination of crystal orientation, and may be useful in imaging.

The excitation may be applied from two or more directions, preferably substantially orthogonal, and said profile information obtained for each direction. For example, the sample may be probed from different (e.g. 3 orthogonal) directions; this may be useful in obtaining a composite 3-dimensional image.

The sample may be physically moved with respect to the coil (i.e. by moving either or both of the sample and the coil). This is simple to implement, and has the advantage that a direct correlation between physical position and observed readings can readily be obtained. It may be useful, particularly in combination with other methods discussed below, for scanning in one direction for example to assemble a 3D image from a series of 2D slices, where an article is already moving. It may be useful, for instance, for imaging packages on a conveyor belt.

Thus, the profile information may be used for forming an image of the sample, the method further comprising constructing an image of the sample from at least one set of profile information.

In addition to imaging of the distribution of material in an object, the invention may also be applied to characterisation of temperature profiles within a sample. Alternatively, the method may be used for characterisation of other parameters which affect the resonance response of a sample, for example pressure—this may be used for example to produce a stress profile of a sample. Other applications will be apparent to those skilled in the art.

Thus, in an important second aspect, the invention provides a method of forming an image of a sample containing quadrupolar nuclei, the method comprising applying excitation to the sample, the excitation having a field strength preferably varying according to a given function of position and being selected to produce a detectable response signal resulting from NQR interaction between the excitation and the quadrupolar nuclei, the response signal being resolvable into phase-dependent and amplitude-dependent components, resolving the response signal into two received components representative of said phase-dependent and amplitude-dependent components and, based on both received components, producing an image representative of the distribution and/or environment of said nuclei in the sample.

Preferably the excitation is repeated a plurality of times (preferably at least 10, 20, 50, 100, 200, 500, 1000 or more times) and at least one of excitation pulse amplitude and excitation pulse duration is varied as the excitation is repeated. This may yield a set of received components which may be processed to produce an image. The step of producing an image may include transforming the data (from a plurality of repetitions), for example according to a Hankel transform or a Fourier transform, or may include correlating the data to a distribution pattern which would be expected to produce similar data, for example by a Maximum Entropy Method.

Preferably the position of responsive nuclei is determined based on a phase parameter which varies as a function of phase of the received components and is determined either from the phase of the received signal or from a combination of two received components which vary with both phase and amplitude of the received signal, for example from a ratio of two quadrature components.

A visual output may be produced of the image.

The second aspect may use any of the preferred or optional features of the previous aspect, and may include the previous aspect.

In addition to the imaging and profiling facilitated by use of phase, as briefly mentioned above, the phase information provided by the method of the first aspect may be used to suppress noise (this may still be applied where the phase information is additionally used in imaging). Thus, a preferred method includes obtaining a phase parameter (which varies as a function of phase of the detected signal) from the resolved components, and processing both resolved components using the phase parameter to produce an output having a signal-to-noise ratio greater than that of the response signal amplitude.

This important feature may be provided as a third aspect in a method of probing a sample to detect quadrupolar nuclei therein, the method comprising applying excitation to the sample, the excitation being selected to stimulate a response signal having detectable phase and amplitude components resulting from NQR interactions with the quadrupolar nuclei, detecting the response signal and resolving the detected signal into phase-dependent and amplitude-dependent components, obtaining a phase parameter from the resolved components and processing both resolved components using the phase parameter to produce an output having a signal-to-noise ratio greater than that of the response signal amplitude.

Preferably, the processing includes identifying mutually inconsistent values of the resolved components as representative of spurious signals. This may provide an efficient way of filtering out spurious signals. The phase parameter obtained with the invention is unique to NQR response signals, as it depends on the polycrystalline nature of the sample and the known dependence of the transition probability on the orientation of $B_1$ in the electric field gradient frame of reference; piezo-electric responses or acoustic ringing will not exhibit the same phase relationships.

The processing may include applying a first excitation to produce a first received signal in which a desired signal has a first phase dependence, and applying a second excitation to produce a second received signal in which the desired signal has a second phase dependence, and detecting the desired signal on the basis of the first and second received signals and corresponding measured phase dependence thereof. Thus, the desired signals may be found by looking for a particular phase "signature".

Preferably also, the true quadrupole resonance signal is distinguished from any spurious signal in dependence on its (time) gradient, curvature or shape, perhaps in dependence upon whether the true and spurious signals have gradients of opposite sign.

The preferable and optional features discussed above in relation to other aspects may apply to this aspect, as will be well-understood by one skilled in the art.

The excitation may be varied to enable reliable imaging for a variety of environmental parameters (e.g. temperature), as discussed in our earlier patent application published as GB-A-2,284,898.

The above aspects may provide reliable methods for obtaining positional information.

The accuracy of the positional information obtained may be enhanced by determining the distances of a cluster of responsive (quadrupolar) nuclei from two or more reference points and calculating positional information based on the respective distances.

This can be provided independently, and according to a fourth aspect, the invention provides a method of determining the position of quadrupolar nuclei in a sample comprising applying excitation to the sample to produce a detectable NQR response, detecting a first response signal from said nuclei and determining a first distance of the nuclei from a first reference point; detecting a second response signal to determine at least a second distance of the nuclei from at least a second reference point; and determining positional information of said nuclei on the basis of said distances from said reference points. The first and second response signals may be detected by separate receiver coils at positions corresponding to the reference points.

The positional information may actually be the position of the nuclei in a particular reference frame, but the term "positional information" is intended to include any position-related parameter; for example velocity or acceleration may be determined by such a method.

Preferably, the positional information is determined by triangulation, and in a preferred arrangement a third distance from a third reference point is determined.

A plurality of coils may be used for transmission and/or reception of signals, each coil preferably being associated with a corresponding reference point; preferably a plurality of receiver coils are used to detect the response signal produced after excitation from a transmitter coil arrangement.

The detection of the distances from each reference point may be sequential or simultaneous.

The fourth aspect may be used independently, but preferably is combined with one of the earlier aspects; this can provide a more accurate indication of position. Most preferably, the excitation is arranged so that the phase of the response signal varies with the position of responsive (quadrupolar) nuclei with respect to a transmitter coil, and preferably both the phase and amplitude of the detected signal from each of a plurality of receiver coils is used to determine positional information.

The above methods may be applied to detection of a single substance at a single resonance frequency. It is also possible, and may be highly desirable in certain applications to repeat the measurements for a variety of different frequencies, corresponding to resonant frequencies of various substances of interest. For example, a sample may be scanned at frequencies corresponding to the resonant frequencies of one or more known explosives or components of explosives and/or at frequencies corresponding to one or more known narcotics or narcotic components.

Alternatively, the frequencies may correspond to resonant frequencies of biological substances of interest in a patient. The results of each scan may be combined to produce a better characterisation of the sample under test, for example by overlaying images obtained from each scan. This may produce a composite image (which may be displayed as a colour-coded image) identifying particular regions of interest within an article. In addition the results of one or more such scans may be combined with or compared to characterisation, such as images, obtained by other methods, for example X-Ray imaging.

In addition to the substances discussed above, the above NQR testing or imaging aspects of the invention may be applied to detection of proteins, hormones and other constituents of a human or animal body, for instance for medical imaging. Of particular interest in this respect is detection of $^{127}I$ (I=5/2), which is present in thyroxin.

Surprisingly, it has been found that although nitrogen is readily detectable in compounds such as explosives using NQR testing, and is present in most biological compounds including proteins, detecting the NQR response of iodine in a biological compound or complex containing iodine (and nitrogen) may give advantageous results.

Based on this surprising finding, in a fifth aspect, the invention provides a method for NQR testing a biological specimen containing a particular substance containing iodine nuclei and preferably other quadrupolar nuclei (most preferably nitrogen), comprising applying excitation to the specimen, the excitation being arranged to produce an NQR response from the iodine nuclei, and detecting the response signal from said iodine nuclei (if present). Although detection of nitrogen in substances such as explosives has been found to work well, it has hitherto been troublesome to detect biological substances such as proteins from their NQR response.

This may be used in conjunction with the other aspects and preferred features described herein, and may in particular be used in conjunction with the imaging methods described.

Particularly useful results are obtained if the substance is thyroxin or a thyroxin derivative, precursor or analogue, and preferably wherein the specimen includes a mammalian thyroid gland. As well as $^{127}I$, other quadrupolar nuclei such as $^{35}Cl$ (I=3/2) may be detected in a similar way. This may be particularly useful in "tagging" experiments where it is required to follow the rate of uptake or loss of a given tagged species, for example in the thyroid gland or other organs such as the kidneys or liver.

The invention also provides apparatus arranged to perform all methods disclosed herein.

In a sixth aspect, the invention provides apparatus for detecting an NQR response in a sample containing quadrupolar nuclei, the apparatus comprising excitation means arranged to generate an excitation signal capable of exciting an NQR response having detectable phase and amplitude components; transmission means arranged to transmit the excitation signal to the sample; detection means arranged to detect a response signal generated by the sample to produce a detected signal; resolving means arranged to resolve the detected signal into first and second components; signal processing means connected to the resolving means to receive both components for processing the response signal based on both phase-dependent and amplitude-dependent components thereof; and control means for controlling operation of the apparatus.

The excitation means may be arranged to generate at least two pulses differing in phase by a predetermined angle, preferably 90 degrees, or other advantageous excitation waveforms discussed above in relation to the method aspects.

The transmission means may be arranged to generate a radio-frequency field having a field strength varying according to a given pattern throughout at least a portion of the sample; this may enable positional information to be detected from the response signal. The control means may be arranged to cause the transmission means to generate a plurality of said given patterns. This may enable several measurements to be made under different conditions.

The transmission means may comprise at least first and second coils (for example of different sizes and/or at different positions or orientations) for producing respectively, on excitation with a radio-frequency electrical signal, at least first and second radio-frequency fields varying in strength as different functions of position in the vicinity of the sample, wherein adjustment of the relative amplitudes of electrical signal supplied to each coil alters the pattern of the net radio-frequency field. These may include a coil (e.g. a coil arrangement such as a Helmholtz pair) for generating a field having a substantially constant field strength in the vicinity of the sample. Such arrangements may facilitate application of a desired field pattern to a sample.

The apparatus preferably includes means to store or to calculate the or each given pattern to provide an estimate of transmitted radio-frequency field strength at a plurality of positions, and having weighting means for determining an adjusted value of received signal strength based on the received signal strength and the estimated field strength at a position in the sample corresponding to the source of the received signal. This may enable a more accurate determination of the amount of responsive nuclei in a sample from the received signal strength.

Preferably, the resolving means is arranged to resolve the received signal into components having a quadrature relationship, for example by employing a quadrature detector. This provides a convenient arrangement for producing two components from which a phase parameter can be determined.

The apparatus may include means for causing a variation in at least one environmental parameter which affects said NQR interaction throughout at least a portion of the sample. This may be used for further encoding of positional information.

Preferably, the signal processing means is arranged to sample the detected signal for a predetermined time, and to store two components which together contain both phase and amplitude information. This may facilitate determination of a phase parameter.

Each feature of each method aspect of the invention can be applied to the apparatus aspect as appropriate.

The phase information provided by the invention can be used in a number of ways including those discussed in more detail below. In another aspect, the invention provides use of the phase of an NQR response signal from quadrupolar nuclei in the determination of the position of the nuclei, or in imaging of a sample containing the nuclei, or in reduction of noise in the NQR response signal.

Preferred features of the present invention are now described, by way of example only, with reference to the accompanying drawings, in which.

APPARATUS

Figure 1A:
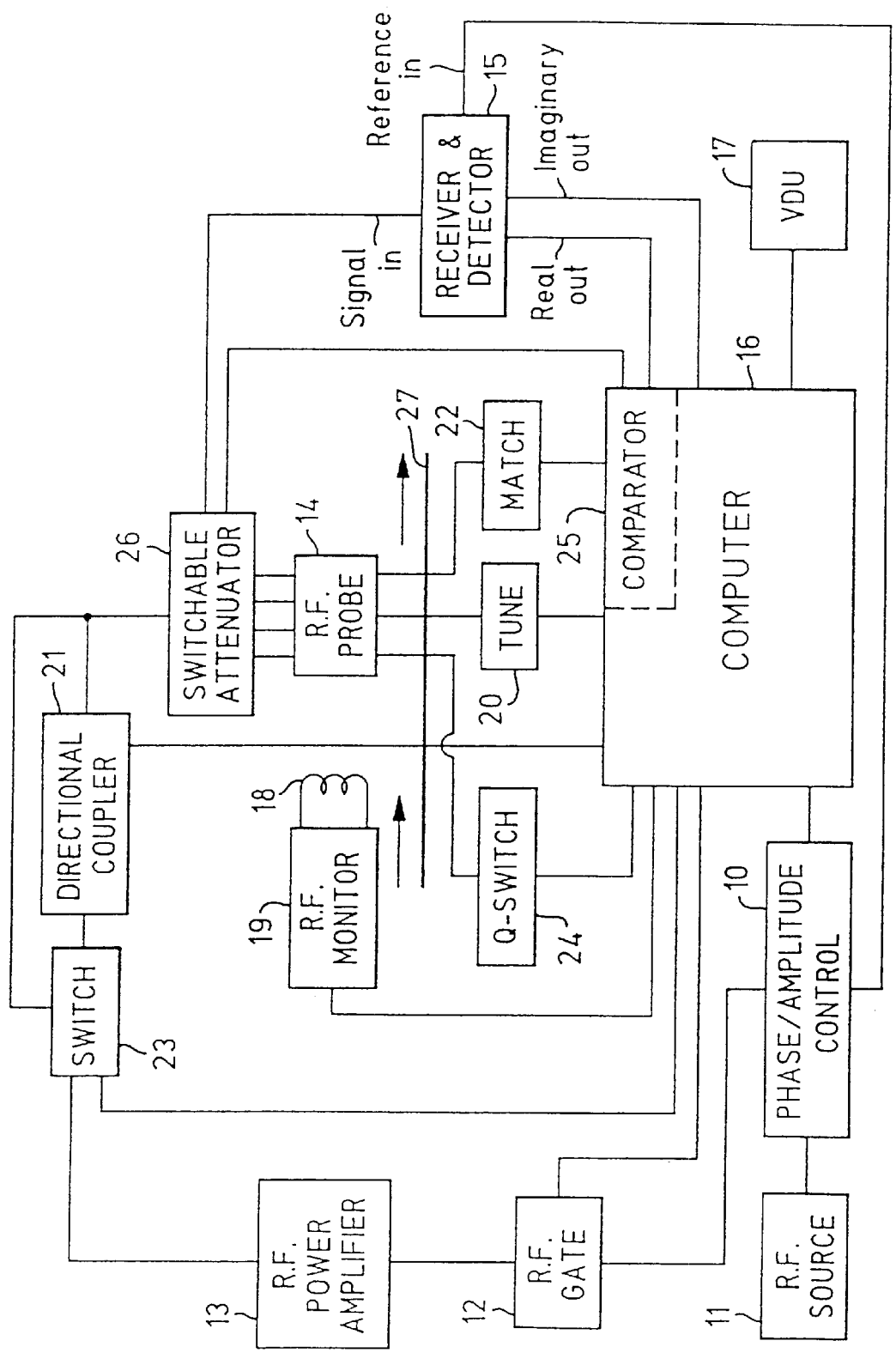
FIG. 1A is a schematic diagram of apparatus for NQR imaging according to a first embodiment of the present invention.
Figure 1B:
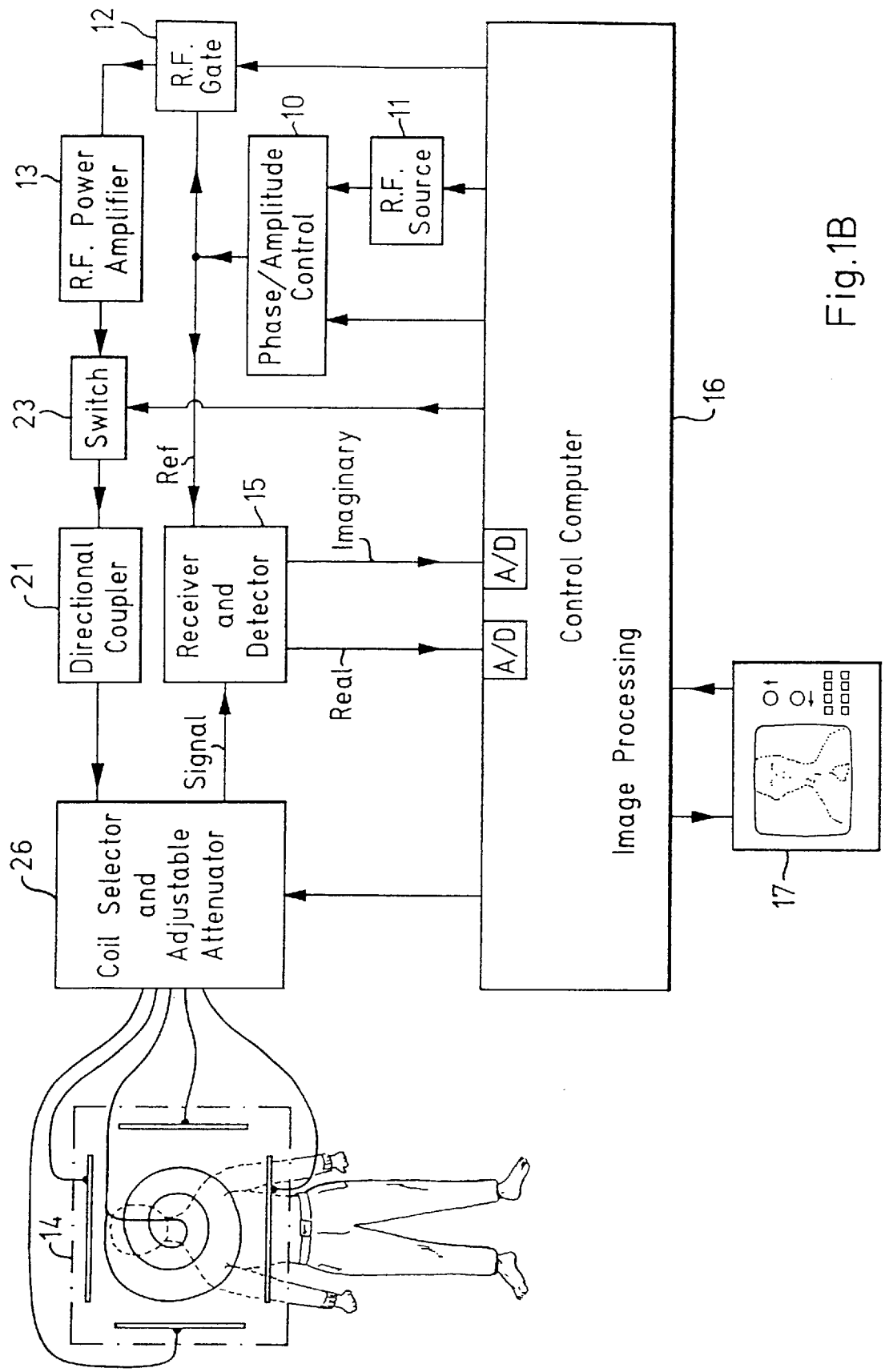
FIG. 1B is a schematic block diagram of apparatus for NQR testing according to a second embodiment of the invention.

Referring to FIGS. 1A and 1B, two embodiments of the apparatus will be described first for a better understanding of the subsequent description of the theoretical and method aspects of the embodiments of the invention; the function of the various parts will become more clear during the discussion of the techniques for testing and imaging.

EMBODIMENT 1

Referring to FIG. 1A, apparatus for NQR testing according to this embodiment includes a radio-frequency source 11 connected via a phase/amplitude control 10 and a gate 12 to an r.f. power amplifier 13. The output of the latter is connected to an r.f. probe 14 containing one or more coils by means of which the sample can be irradiated with r.f. pulses at the appropriate frequency or frequencies to excite nuclear quadrupole resonance in substances of interest. The arrangement of coils in the probe 14 of this embodiment is discussed in more detail below. The frequency, phase, and power are controlled by control computer 16, as will be discussed below in the discussion of the method.

Coil Arrangement

In the first embodiment of the apparatus, the probe contains (in parallel) a spiral coil on one side of the sample and a Helmholtz pair located either side of the sample. One example of the spiral coil is an Archimedean spiral which produces a field which varies approximately as a function of $r^{-3}$ (where r is distance from the coil); the Helmholtz pair produces a substantially constant field. An example of another arrangement which achieves a similar effect is a Helmholtz pair in which one coil has more turns than the other. The amplitude of signals fed to (and received from) each coil is adjusted under the control of the computer 16 by means of switchable attenuator 26, which in this embodiment is arranged to switch the amplitude of signals to each coil in discrete steps to allow several different field patterns to be established. In a modification of this embodiment, the amplitude of signals to each coil is continuously adjustable.

The same probe 14 functions as both a transmitter and receiver in this embodiment, and is therefore also connected to r.f. receiver and detection circuitry 15 for detecting nuclear quadrupole response signals.

A single coil, e.g. an Archimedean spiral coil or a surface coil, may be used (in which case the attenuator 26 may be omitted to simplify the apparatus), but the provision of at least two coils producing different field patterns, and means for adjusting the amplitude of exciting signal delivered to each coil offer more flexibility in varying the field strength pattern; the minimum and maximum field levels, corresponding to the minimum and maximum flip angles for a given pulse length, may readily be set to desired values. One skilled in the art will be aware that computer programs which calculate field patterns for given coil patterns and enable deduction of an appropriate coil configuration capable of producing a desired field pattern are readily available. For example, software entitled "Mega" which is commercially available from Bath University, England has been used to determine the coil configurations necessary to produce the field patterns required in Magnetic Resonance Imaging.

Variation in Field Strength

In this embodiment the field strength varies with position so the magnitude of the response signal will be affected, and this must be taken into account. In this embodiment, the control computer 16 is programmed to calculate the expected field strength at any particular position in the vicinity of the sample for a given set of receiver excitation amplitudes. The precise way in which this is achieved may be varied. For example, the overall shape of the field pattern may be calculated according to a formula (theoretical or empirically corrected) for the pattern from the coils used. This may be scaled by an empirically determined adjustment factor, based on observed field strength at one or more locations. Alternatively, the spatial variation of the field from the exciter coil arrangement is measured and stored as a look-up table in memory means (which may be a part of the control means 16). Interpolation may be used between stored data points.

Arrangement for Resolving Signal into Two Components

In this embodiment, the detector 15 includes a quadrature detector which receives a reference r.f. signal from the phase/amplitude control 10, and produces a real output based on the component of the received signal in phase with the reference signal and an imaginary output based on the component of the received signal having a phase difference of 90 degrees (either lead or lag may be used provided this does not change unpredictably) to the reference signal. Both of these outputs are separately digitised, and stored in the computer 16.

In this embodiment, the computer 16 is arranged to obtain the values of two components which are phase and amplitude dependent from the digitised outputs (after sampling for a time preferably at least equal to the Free-induction-decay period) by Fourier transforming the outputs and integrating the resulting waveforms between two points, preferably the full-width half-power points centred on the peaks found at the resonant frequency. This yields two values (one for each output of the detector) representative of the magnitude of the response signal; this arrangement is found to give components with a good signal-to-noise ratio.

However, the arrangement for obtaining the components is not critical, and others may be employed. References throughout this specification to two components are intended to include, for example, values obtained from the outputs of a quadrature detector by integrating the area under the Free-induction-decay curve envelope (e.g. by digitising the signal), or by taking the peak value of output signals at a particular instant in time, or by Fourier transforming the received signal and taking the peak value or by integrating between two points as mentioned above. Although the output of a detector will usually be sampled for a period of time (e.g. at least the Free-induction-decay time) and a single value for each component produced from the results of the sampling (to reduce noise), it may be desirable in some instances to obtain a plurality of values for each component, for example over a series of time increments, and references to two components are intended to include time-varying values as well as average or total values. It is, of course, important to ensure that the components obtained reliably reflect the f.i.d. This normally implies that the "dead time" of the apparatus should be much shorter than $T_2^*$ and the f.i.d. should not be truncated by other (unknown) factors.

It will be understood that there are many ways in which one can obtain two values which are representative of both the phase and magnitude of the response of a sample. In this preferred arrangement, the resolution of the signal is implemented at least partly in hardware. However, the resolving function may be incorporated into the function of the control computer 16 or other processing means. Where the data are processed downstream, the minimum resolving function that needs to be incorporated in the apparatus itself is the inclusion of sufficient information to enable downstream extraction of phase and amplitude information from the digitised data.

Control of Variable Parameters

In this embodiment, the control computer 16 also controls all pulses, their radio frequency, timing, duration, amplitude and phase. In the context of the present invention all of these parameters may need to be adjusted precisely; for example, the duration and amplitude of the pulses may be adjusted to image different sections of the sample, and phase may be varied in order to resolve distances more accurately.

The computer 16 is also arranged to repeat application of pulses as necessary to scan or image the region of interest within the sample. In addition, in embodiments in which one or more gradients such as magnetic field, electric field, temperature or pressure, gradients are superimposed on the sample to assist in imaging or in stress or thermal analysis, the computer 16 is normally arranged to control (at least partly) the imposition of that or those gradients.

Re-tuning of the r.f. probe 14, alteration of its matching and alteration of its Q factor may all need to be carried out dependent upon the nature of the sample. These functions are carried out by the control computer 16 as follows. Firstly, the computer checks the tuning of the r.f. probe 14 by means of a pick-up coil 18 and r.f. monitor 19, making adjustments by means of the tuning control 20. Secondly, the matching to the r.f. power amplifier 13 is monitored by means of a directional coupler 21 (or directional wattmeter), which the computer responds to via a matching circuit 22, which in turn adjusts the r.f. probe 14 by means of a variable capacitance or inductance. The directional coupler 21 is switched out by the computer 16 when not required, via switch 23. Thirdly, the Q factor of the r.f. coil is monitored by a frequency-switch programme and adjusted by means of a Q-switch 24 which either changes the coil Q or alternatively alerts the computer to increase the number of measurements.

Other Features

This embodiment includes transport means, such as a conveyor belt or movable platform 27 to move the sample relative to the coil(s), to image or test different portions of a sample or a succession of samples. The computer 16 may be arranged to time the application of the first excitation pulses substantially simultaneously with the arrival of a particular sample adjacent the probe. Other arrangements for moving the probe relative to the sample may be used. For example, instead of the sample being carried on a conveyor belt, it may actually be a person, and the r.f. probe may be in the form of a walk-through gateway or a hand-held wand. A movable probe may have means for transmitting information representative of the position and or orientation of the probe relative to a reference position, to facilitate investigation of an object larger than the probe by moving the probe around the object.

Image Construction and Display Apparatus: Data Processing

The control computer 16 in this embodiment is also arranged to construct an image from the received data, as will be described in more detail below. In particular, it calculates a phase parameter from a ratio of two components obtained as described above. However, particularly where image data are formed from the received signal, the data may be processed further (for example for image enhancement or recognition) downstream of the control computer 16.

The results of the testing, in this embodiment, are displayed on graphical display apparatus comprising VDU 17. The results may be presented as a profile of the sample, which will indicate where in the sample (e.g. a suitcase) a responsive substance (e.g. an explosive) may be found. The results may simply be used to produce an alarm if a profile according to predetermined criteria is found. This may be particularly useful, for example in detecting sheet explosive in luggage, or may be useful in detection of a bodily tumour. Alternatively, an output representative of the distance of the majority of the quadrupolar nuclei or of their distribution or of the quantity is provided. This may be particularly useful, for example, in a modified apparatus in which the probe 14 is arranged for determining the location of underground explosives, or the location of a desired substance in a body. It will be understood that the information obtainable with this invention can be used in a number of ways, and with the teaching presented herein, one can select a method appropriate to a particular application.

Other Conditions

Although the apparatus described above would usually employ rectangular pulses, other pulse shapes, for example adiabatic pulses as described in our earlier International Application Number WO 92/21989 may be employed. Furthermore although usually the radio-frequency probe would utilise a single coil for both transmission and reception of signals, any appropriate number of coils may be used, and different coils can be used for transmission and reception.

The apparatus would usually operate in the absence of any applied magnetic field. However, in cain circumstances, it may be desirable to superimpose magnetic field gradients on the sample, as this may improve spatial resolution. In contrast to NMR imaging, however, the invention does not require a strong homogeneous magnetic field in addition to any magnetic gradient imposed on the sample. Preferably, the average magnetic field in the vicinity of the sample is no greater than the maximum variation in magnetic field strength across the sample. Preferably, the average value of the magnetic field, or the value of the magnetic field minus the peak variation in the strength of the magnetic field is less than 0.1T, and preferably less than about 0.01T, or of the order of the earth's magnetic field. Preferably, any magnetic field applied to the sample is applied only by means of an arrangement of coils which generate a substantially non-uniform field in the vicinity of the sample. Thus, the drawbacks of the requirement with NMR imaging for a coil arranged to provide a strong homogeneous field can be alleviated.

EMBODIMENT 2

This embodiment, illustrated schematically in FIG. 1B, has a number of features in common with the above embodiment; like parts are designated by like reference numerals and the following description concentrates on the differences between the embodiments.

The second embodiment is specifically concerned with imaging an object, for example a portion of a person as illustrated.

Coil Arrangement

In this embodiment, the r.f. probe contains 3 sets of coils, and the switchable attenuator 26 is used to select the field direction as well as the intensity pattern. Each set of coils comprises an Archimedean (or similar) spiral coil at one side of the sample space, and a Helmholtz pair either side (as shown in FIG. 1B, the torso of a patient extends through the centre of one of the Helmholtz coils). Other parts, such as arms, legs, the head or the neck of the patient may be accomodated.

In a further alternative embodiment, not shown, separate receiver/detection circuitry 15 is provided for each direction to facilitate overlapping measurements from each direction. Whilst a single coil can readily provide profile information in one direction, to form a two or preferably three dimensional image, information in more than one direction is required. Three orthogonal coils should theoretically enable 3 independent measurements from 3 different directions.

In practice, the measurements are not fully independent, due in part to divergence of the magnetic fields from the coils. Nevertheless, the profiles obtained in the three directions enable a three-dimensional image of the sample to be constructed. Some distortion may be observed, particularly where responsive nuclei are located far from the axes of the coils. Thus, for best results, the object of interest (here the thyroid gland) is positioned approximately at the centre of the apparatus, to enable more accurate imaging.

In this embodiment, the amplitudes of signals fed to each coil are continuously adjustable by means of adjustable attenuator 26, to enable precise control of the field pattern. It will be appreciated that, instead of an adjustable attenuator coupled to the output of a single power amplifier, a plurality of adjustable power amplifiers may be used, one for each coil; this may have benefits, particularly when large powers are used.

Processing of Data and Image Display

In this embodiment, where large amounts of data are collected, for example to produce a high resolution 3-dimensional image, it may be desirable for the control computer to be arranged to control the apparatus and acquire the data desired, and then pass the data to a separate processor (e.g. of greater processing power) as raw, partially-processed, or filtered data. Thus the image processing function of the control computer 16 may in practice be implemented remotely. The apparatus may include hardware specifically designed to implement mathematical transforms (e.g. Fourier transforms, Hankel transforms) to achieve faster image processing. Image construction techniques are discussed in more detail below. In variants, as mentioned above, the image may be subjected to image processing or image recognition algorithms before being displayed, and may not be displayed at all.

Where an image is displayed on a visual display unit 17, the unit will normally be provided with input controls to enable adjustment of the position or orientation of the portion of sample corresponding to the image displayed. Adjustment may be achieved mathematically based on pre-stored data, or by adjusting the physical sampling conditions, or both.

Other Conditions

The frequency used will typically be appropriate for nitrogen nuclei in the sample, but in some cases other nuclei may be excited. Particularly in the case of a biological substance containing nitrogen and iodine e.g. a thyroxin analogue, it has been found desirable to select a frequency appropriate to iodine in the substance. Of course, the nitrogen or other nuclei may be detected alternatively or additionally in some cases. Typical frequencies range from a megahertz or more for $^{14}$N to several hundred megahertz for $^{127}$I, and powers may range from a few watts or less to the order of a kilowatt or more depending on the sample size and location. At higher powers, as will be understood, care must be taken not to damage the sample, particularly in cases where patients or other biological specimens are investigated.

Other Coil Arrangements

The above exemplary embodiments may be modified in a number of ways to suit the application of interest. Other possible coil arrangements include generally conical or frusto-conical coils, Helmholtz or anti-Helmholtz pairs, or combinations of the above. It will be appreciated that the field from a coil tends to vary approximately as a function of $r^{-3}$ (where r is distance from the coil) near the coil, and as a function of $r^{-1}$ at large distances from the coil. For example, for a circular coil of radius a, the field is proportional to $(r^2+a^2)^{-3/2}$, which approximates to $r^{-3}$ when r>>a and $r^{-1}$ when a>>r.

One or more coils may be connectable in antiphase to other coils (so that the fields subtract rather than add); this may be used to produce substantially zero net field (i.e. zero flip angle) at one or more predetermined locations in the sample.

Concentric coils may be employed for depth profiling, as the field depth (rate of decay with distance) will vary as a function of coil size. If the coils are eccentric, then the depth and centres will vary; such an arrangement may be used to produce further information regarding the distribution of nuclei for cross-checking or comparison with information obtained by the basic method described below.

One or more coils may comprise a plurality of coil elements, and the coil configuration, that is the effective shape of the coil, (for example a generally meanderline coil) may be adjusted by switching elements into or out of circuit.

Arrangement for Determining Position by Triangulation

In addition to the above, or separately, the position of responsive nuclei may be determined by the triangulation method discussed below. A preferred coil arrangement for implementing this will be briefly described.

Two (or more) receiver coils are used to detect the signal resulting from excitation from a separate transmitter coil. The received signal strength at each receiver coil will vary as a function of distance (normally $\alpha r^{-3}$), and this can be used to determine the distance of the responsive nuclei from each coil and hence their position (or other positional information) by triangulation using reference points based on the position of the receiver coils. The phase of the resulting signal should give an indication of the distance from the transmitter coil, if the excitation is chosen as described below, and this can provide a further reference point.

In other arrangements for determining positional information by triangulation, two or more transmitter coils are employed, and used in the determination of distance from each transmitter coil.

As a further arrangement, a single receiver/transmitter coil may be moved with respect to the sample.

TECHNIQUES FOR NQR TESTING AND IMAGING

Introduction and First Embodiment of the Method

Having described the apparatus, methods which may be employed in embodiments of the invention will be discussed, together with a brief theoretical explanation. In a first embodiment of the method of the invention, two radio-frequency pulses comprising a "spin locking" (S.L.) type sequence are employed. This has the benefit not only of producing two detectable components, but also of locking the magnetisation from the first pulse, which can improve the signal to noise ratio and reduce spurious signals.

As is well known, the flip angle produced by a single pulse will be proportional to the product of the amplitude $B_1$ of the pulse and the duration T of the pulse, i.e. $\alpha=kB_1T$, the constant of proportionality k being dependent on the magnetic moment of the nuclei and containing other factors which depend on the nuclear spin quantum number I of the quadrupolar nucleus.

The basic technique for exciting phase and amplitude components is to use an initial pulse of nominal flip angle 90° and phase 0° (termed a "$90°_{0°}$" pulse) to rotate the magnetization into parallelism with (say) the Oy axis of the rotating frame ($M_o$ lies along Oz and $B_1$ along Ox). This pulse is then immediately followed by the spin locking pulse of equal length and a phase shifted by 90° with respect to the first. Hence the combination of the two pulses can be written in the form $(90°)_{0°}$–$(90°)_{90°}$. The combination of two or more pulses is sometimes known as a sandwich or composite pulse. However, herein, throughout, the combination is regarded as two distinct pulses. It will be appreciated that, as discussed further below, the flip angle may vary throughout the sample, and hence a pulse referred to as having a nominal flip angle of 90 degrees may in fact produce quite different flip angles at different points in the sample. For ease of understanding, the case of a single flip angle will be discussed first.

The second pulse has the effect of locking the magnetisation produced by the first pulse. In addition, according to the theory developed pursuant to the invention (presented throughout purely by way of explanation to assist in understanding the invention, and not to be construed as limiting in any way) the second pulse will also rotate the residual magnetisation, i.e. that remaining unaffected by the first pulse onto the Ox axis. Thus the net magnetisation should lie somewhere in the x-y plane (of the rotating frame), the position being dependent on the degree to which the magnetisation was rotated by each pulse. According to the present theory, this orientation should be detectable as the phase of the resulting signal, or the ratio of the real and imaginary components of the received signal (corresponding to the outputs of the resolver 15).

The outputs of quadrature detector 15 comprise two signals obtained from the system responses oscillating at or close to the resonant frequency of the nuclei under test, and decaying according to the free-induction-decay (f.i.d.) time. These signals may be used to provide two components directly, preferably by passing them through a peak value detector or a low-pass filter or by digitising and then integrating, but as discussed above, values for the components are preferably obtained by Fourier transforming the outputs. The results obtained in practice show a phase offset.

Of course observation of a single phase offset does not necessarily convey information, and prior to the invention one would attribute a phase offset to arbitrary delays in the apparatus, but not representative of any information concerning the sample itself.

According to the present theory, this phase offset is not an arbitrary quantity; as well as a constant instrumental offset, there is one representative of the orientation of the spins following two pulses.

Surprisingly, it has been observed that phase encoding is possible in NQR testing, even in the absence of a magnetic field, if the excitation is suitably chosen; the phase can be made to vary in a predictable manner as a function of flip angle.

Variation of Flip Angle

Referring now to the subsequent figures, the effect of varying the flip angle will be explained in more detail, firstly theoretically, and then with reference to actual results; this demonstrates that the observed phase of the response signal is indeed a predictable function of flip angle and not merely a result of delays in the apparatus. As discussed further below, variation in flip angle due to a non-uniform field may be used to obtain positional information from the phase of the detected signal. The differing phase shifts produced by differing flip angles may also be used in the reduction of noise.

Figure 2:
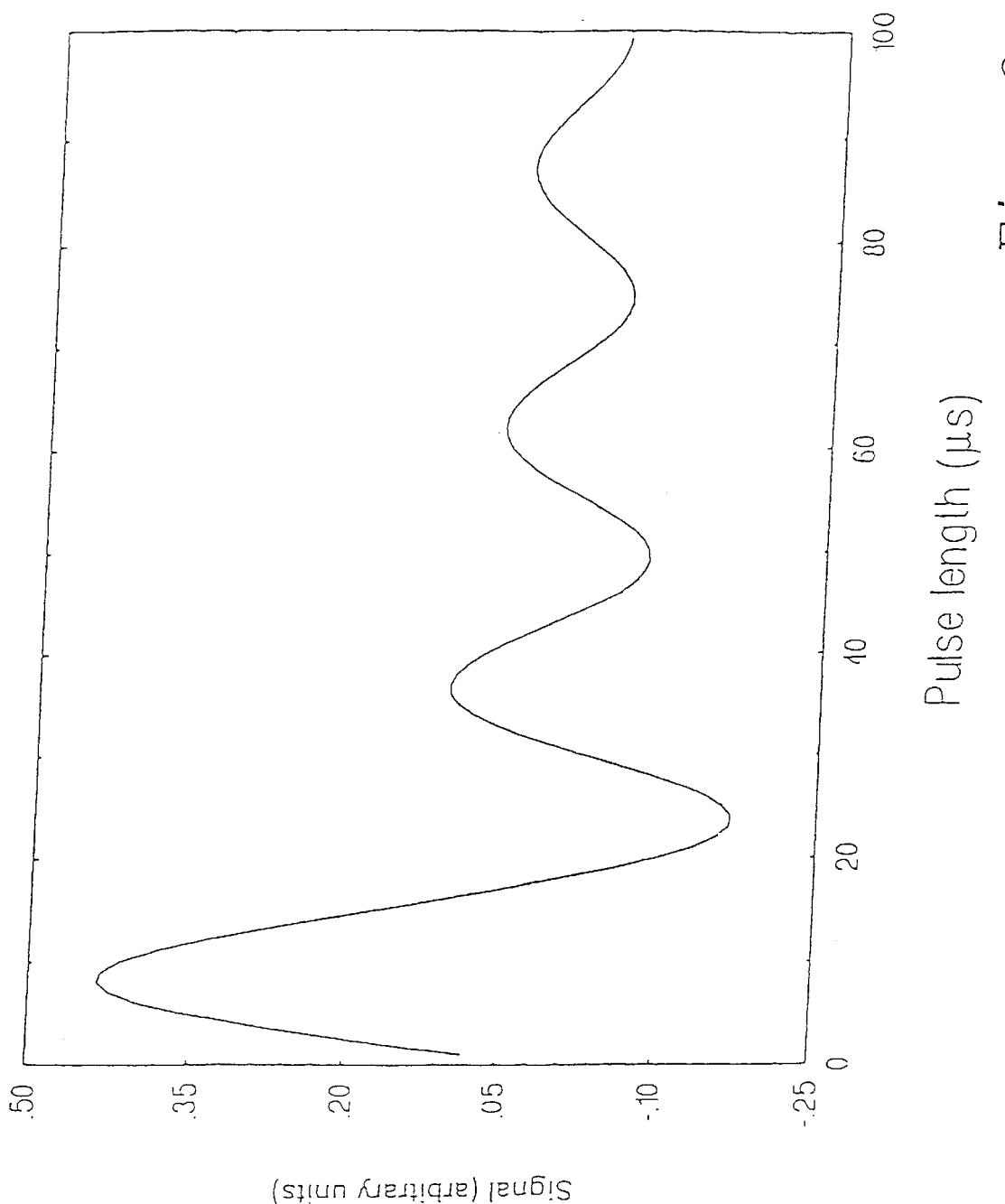
FIG. 2 is a graph showing the NQR response to a single r.f. pulse.

FIG. 2 shows the expected NQR signal intensity as a function of pulse length following a single on-resonance r.f. pulse for a polycrystalline sample. As is well known, the signal has a single phase and the intensity has a Bessel function dependence. This graph is plotted for constant field strength. It will be understood that a similar graph may be obtained if the pulse duration is kept constant, and the field strength varied. If the field strength varies with position, then the amplitude of the signal will give an indication of position of responsive nuclei; this is the principle employed by Rommel et al. in the paper mentioned above.

Figure 3:
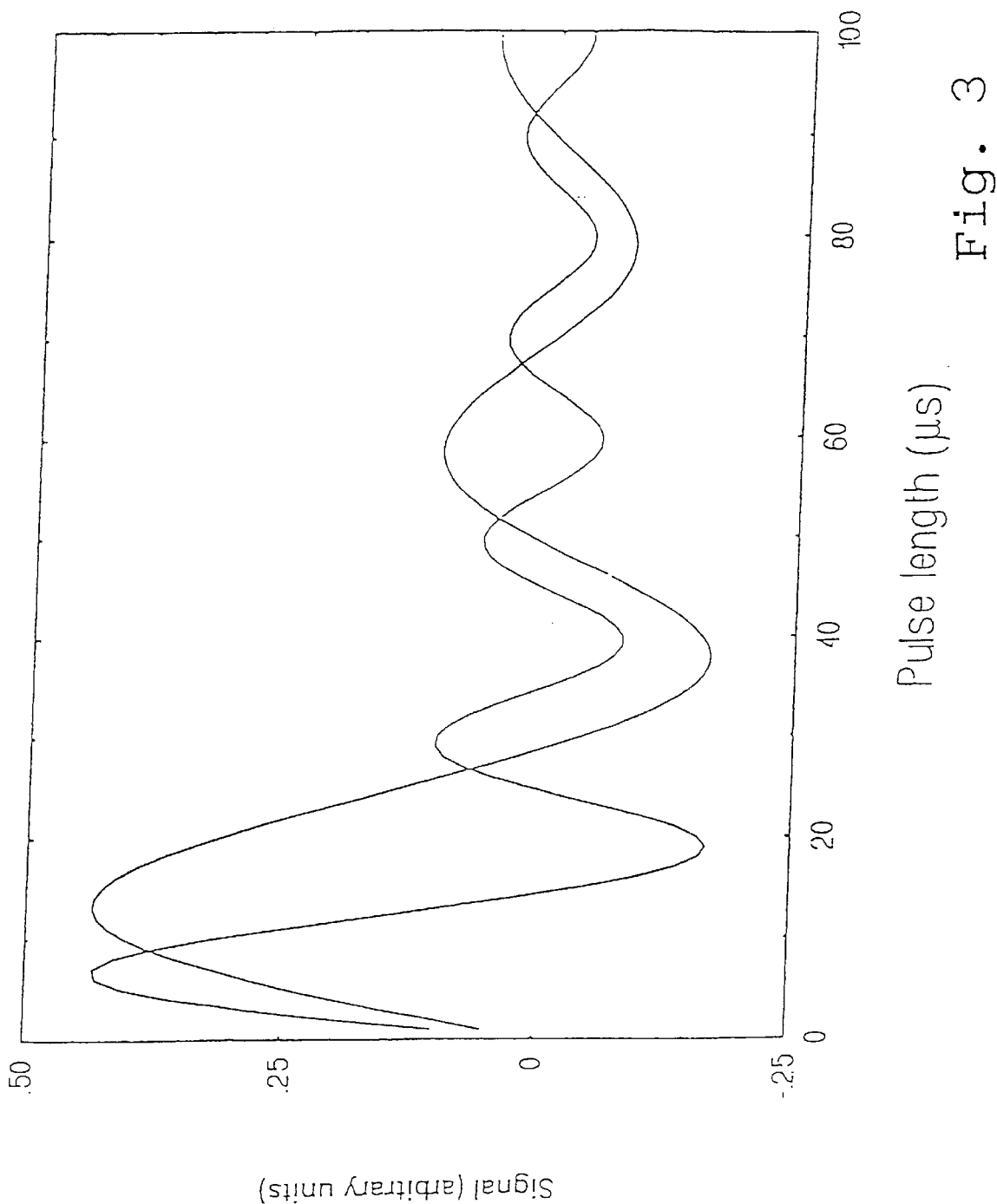
FIG. 3 is a graph showing the real and imaginary NQR response to a pair of pulses of equal length differing in phase by 90 degrees.

Surprisingly, a hitherto unreported phase dependence of the response signal (from a polycrystalline sample) has been observed following excitation with two consecutive (on resonance) pulses (e.g. of equal length) differing in phase by 90 degrees. According to the present theory, assuming that some of the magnetisation is rotated from e.g. the z direction into the x direction (in the rotating frame) following a pulse along the y direction, the response signal from a polycrystalline sample of spin I=1 (as a function of pulse length) following two consecutive pulses of equal length differing in phase by 90 degrees should be as shown in FIG. 3. As can be seen, the expected signal has real and imaginary components. These are the two components produced by a quadrature detector, and can be considered to be the components along the x and y axes of the rotating frame. If x and y are the two quadrature components, then the phase $\phi$ and magnitude A of the signal are given by the equations:

$$A^2 = x^2 + y^2 \quad (1)$$

and $$\tan \phi = x/y \quad (2)$$

Figure 4:
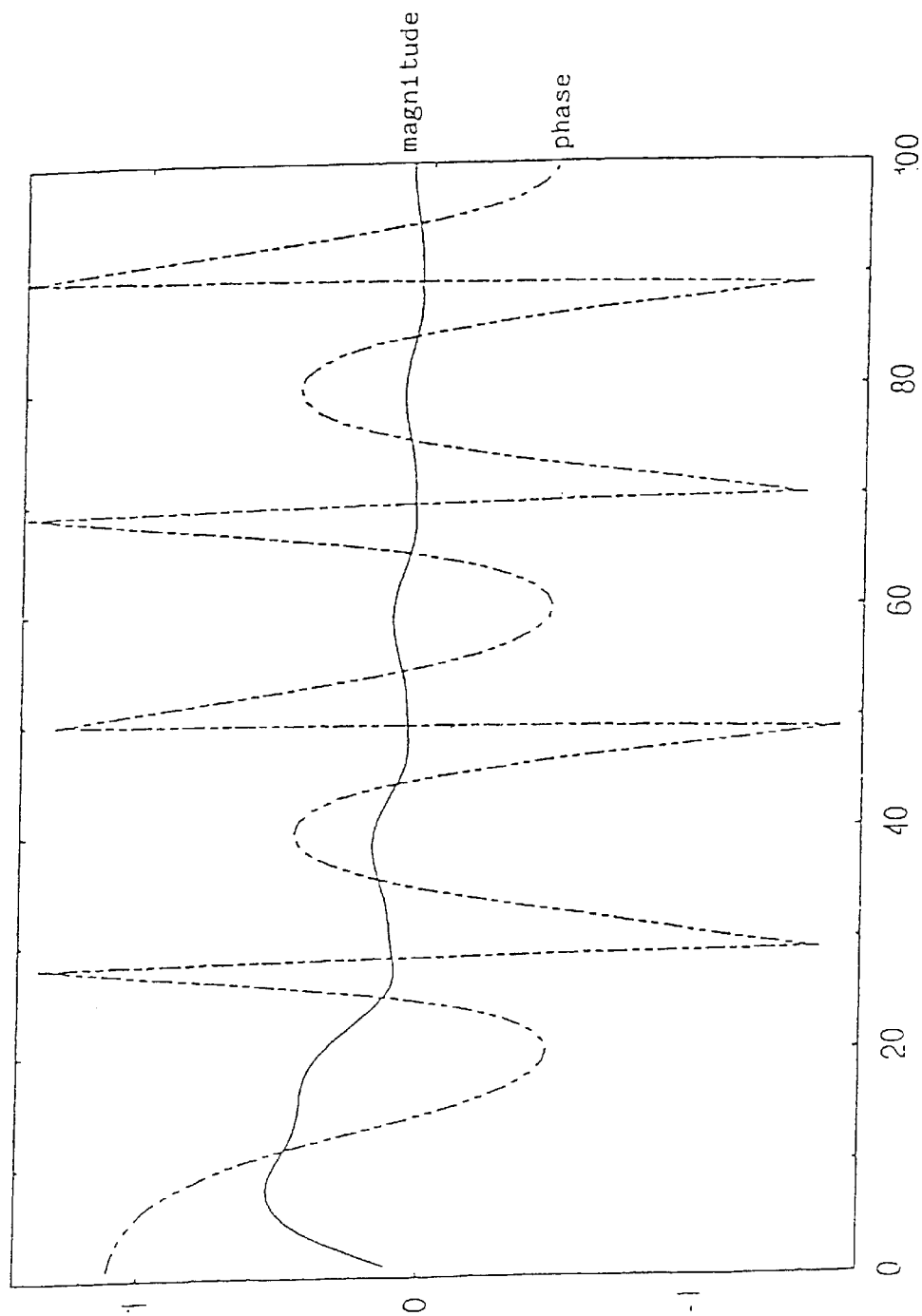
FIG. 4 shows the data of FIG. 3 plotted as phase and magnitude information.

It has been observed that the real component x varies as $J(\alpha)$ and the imaginary component y varies as $J(2\alpha)$, under the experimental conditions described above (equal length pulses for a polycrystalline sample of spin I=1). Where this is the case, the phase and magnitude can also be expressed as known mathematical functions. FIG. 4 shows the same information plotted as phase parameter (x/y) and magnitude information.

The phase difference of the two exciting pulses need not be exactly 90 degrees, but a difference of 90 degrees facilitates discrimination of the two components and allows the second pulse to lock the magnetisation produced by the first. Other phase differences may be used and still enable useful information to be gleaned from the phase of the response signal. In some cases, other angles for example in the range 30°–150°, better 45°–135°, and more preferably 60°–120° or 75°–105° may be employed. As discus below, the pulse durations need not be equal. Furthermore, other features of the excitation may affect the phase of the response signal (for example using off-resonant excitation) and thus although excitation with two pulses is particularly preferred for its ease of implementation and readily predictable results, other excitation may be used.

Figure 5:
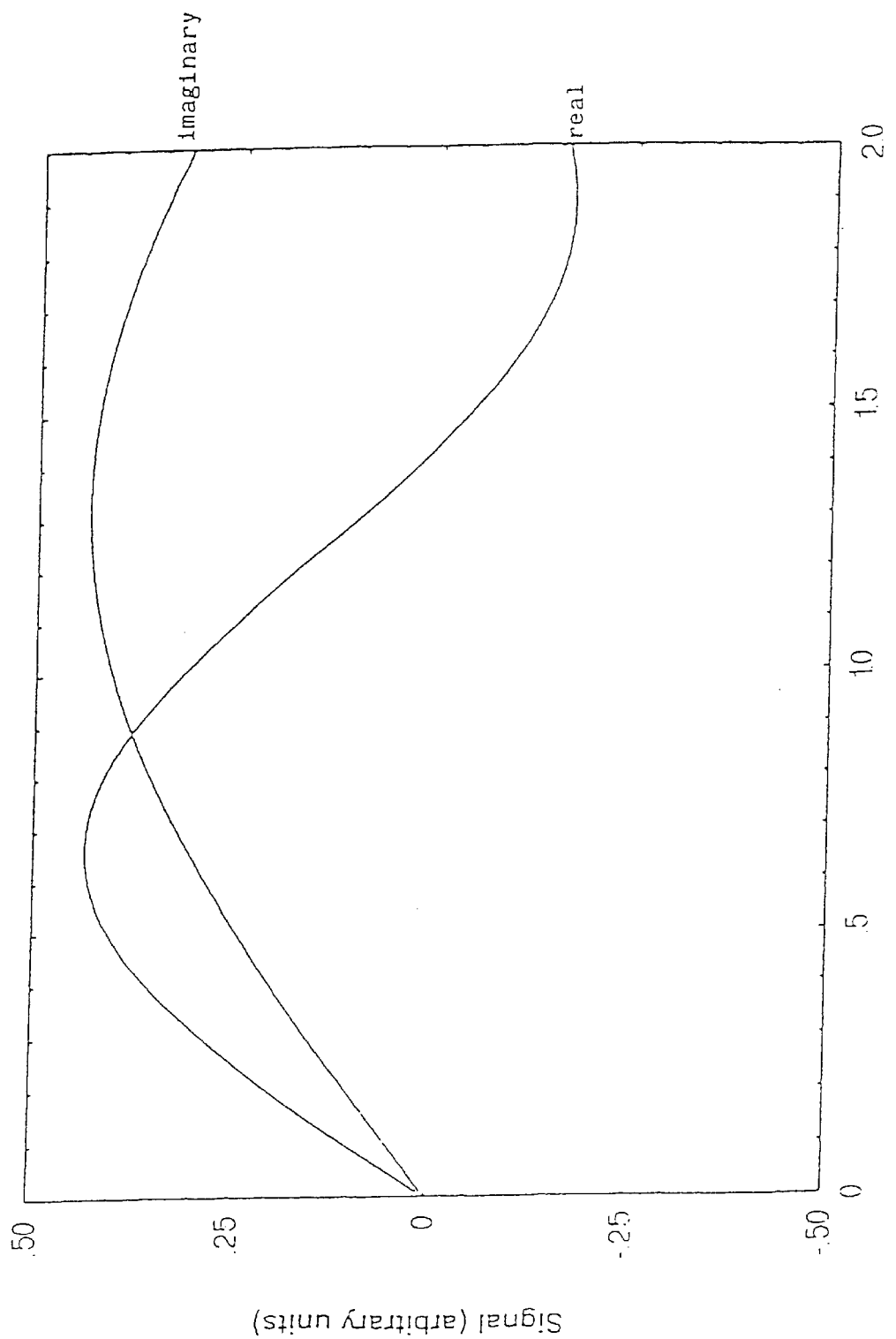
FIG. 5 shows the data of FIG. 3 plotted over a range of flip angles of 0 to $2\pi$.
Figure 6:
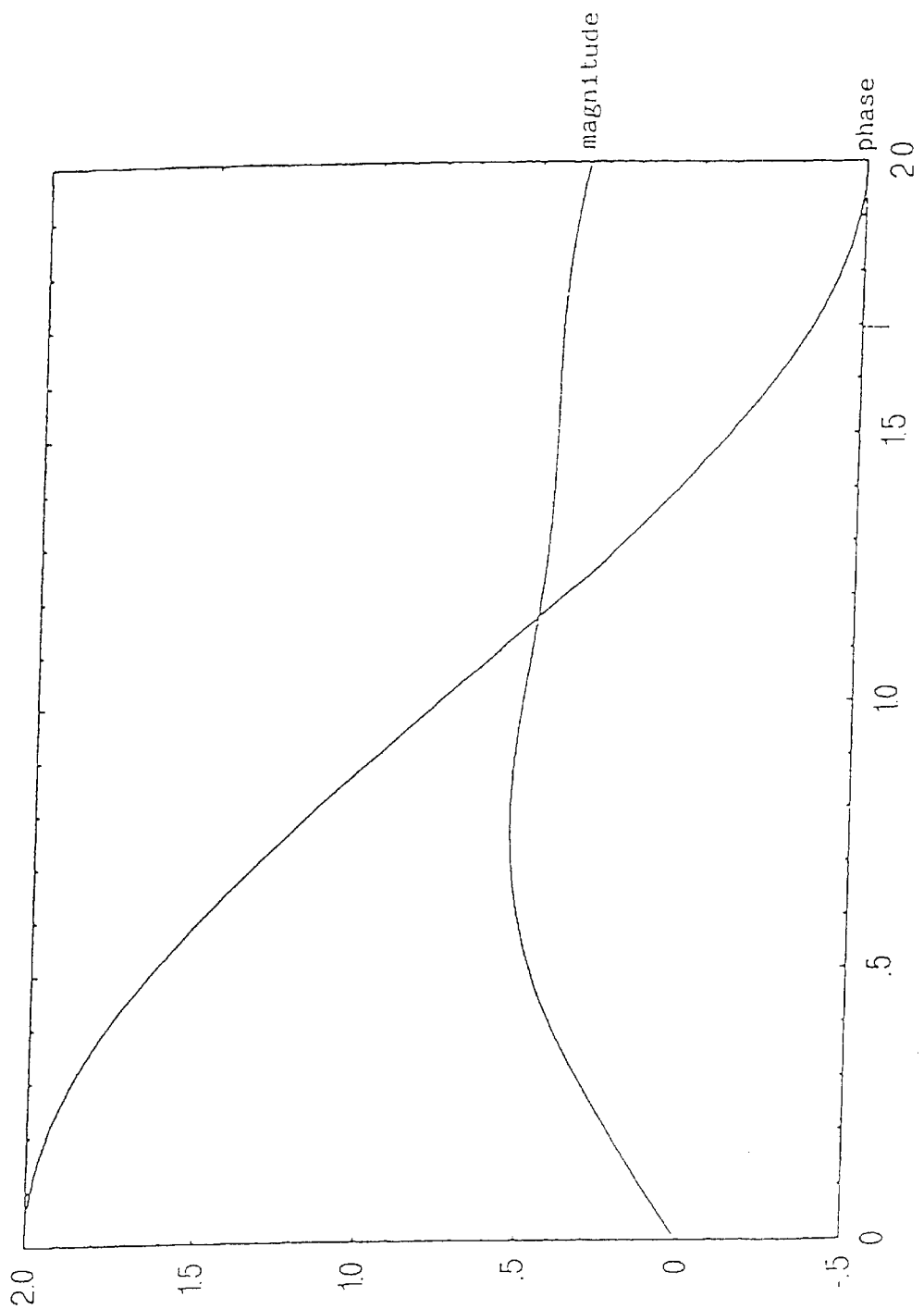
FIG. 6 shows the data of FIG. 4 plotted over a range of flip angles of 0 to $2\pi$.
Figure 7:
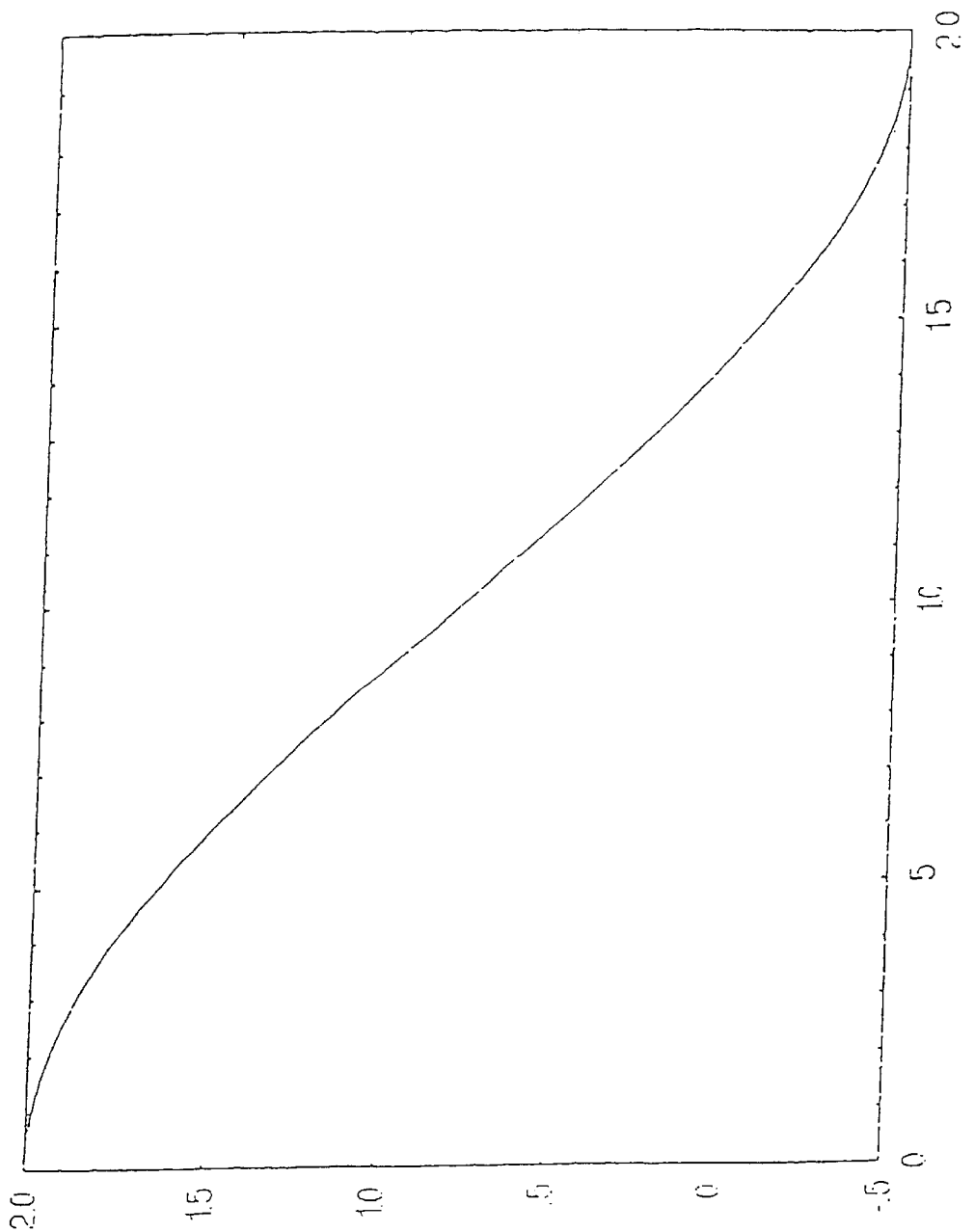
FIG. 7 shows the ratio of expectation values of the real and imaginary components of FIG. 5.

The graphs of FIGS. 3 and 4 are clearly multi-valued over the range of pulse lengths considered. However, if the pulse lengths and/or field strengths are varied so that the total flip angle lies in the range 0 to $2\pi$ (0–360 degrees), and the same data plotted as a function of flip angle, the results can be seen in FIGS. 5 and 6 (in which FIG. 5 is a plot of real and imaginary components, and FIG. 6 is a plot of phase parameter and magnitude). Thus, if the flip angle is varied in the range 0 to $2\pi$ throughout the sample, the phase will be a single-valued function of flip angle. Reference is made above to phase. In fact, a phase parameter which need not actually be phase may be used in practice. In particular the ratio of the real and imaginary components (x/y) may be used as a phase parameter as this is easy and fast to calculate (it does not require calculation of arctangents). FIG. 7 shows clearly that the ratio of the expectation values of the real and imaginary components (a phase parameter) displays a monotonic change in the range of flip angles 0 to $2\pi$.

Obtaining Positional Information or Imaging

As will by now have become apparent, if the flip angle varies throughout the sample, the resulting phase (or phase parameter) will give an indication of position. Thus, in a development of the first embodiment, the magnitude of the exciting $B_1$ field varies with position throughout the sample in a predetermined manner, this being achieved by appropriate choice of transmitter coil or coils 14, as discussed above in relation to the apparatus. By selection of the range of maximum and minimum $B_1$ field values, together with appropriate pulse durations, the range of flip angles in a sample, or in a region of interest, and hence the expected phase angles can be controlled.

From the field at a given position, the pulse duration and the constant appropriate to the nuclei under investigation, the flip angle at a given position can be calculated. If the flip angle varies within the sample in the range of 0 to $2\pi$, the position of a crystal of responsive material within a larger sample can thus be obtained from the phase of the peak corresponding to that crystal by determining the corresponding flip angle from the graph shown in FIG. 6 (or from the ratio of the two quadrature components with reference to FIG. 7), and relating this to position according to the field variation. If the flip angle exceeds $2\pi$ (corresponding to high field strength, near the coil), then it is necessary to use data based on the appropriate segment of the graphs of FIGS. 3 and 4, in which the phase will not be a single-valued function of position. Nevertheless, the position can still be obtained, by taking multiple measurements to resolve any ambiguities. Additionally or alternatively, the amplitude of the signal may be used to give an indication of the appropriate position on the graphs to consider; the amplitude will vary with position, almost invariably diminishing with distance from the probe, in a known manner.

Figure 8:
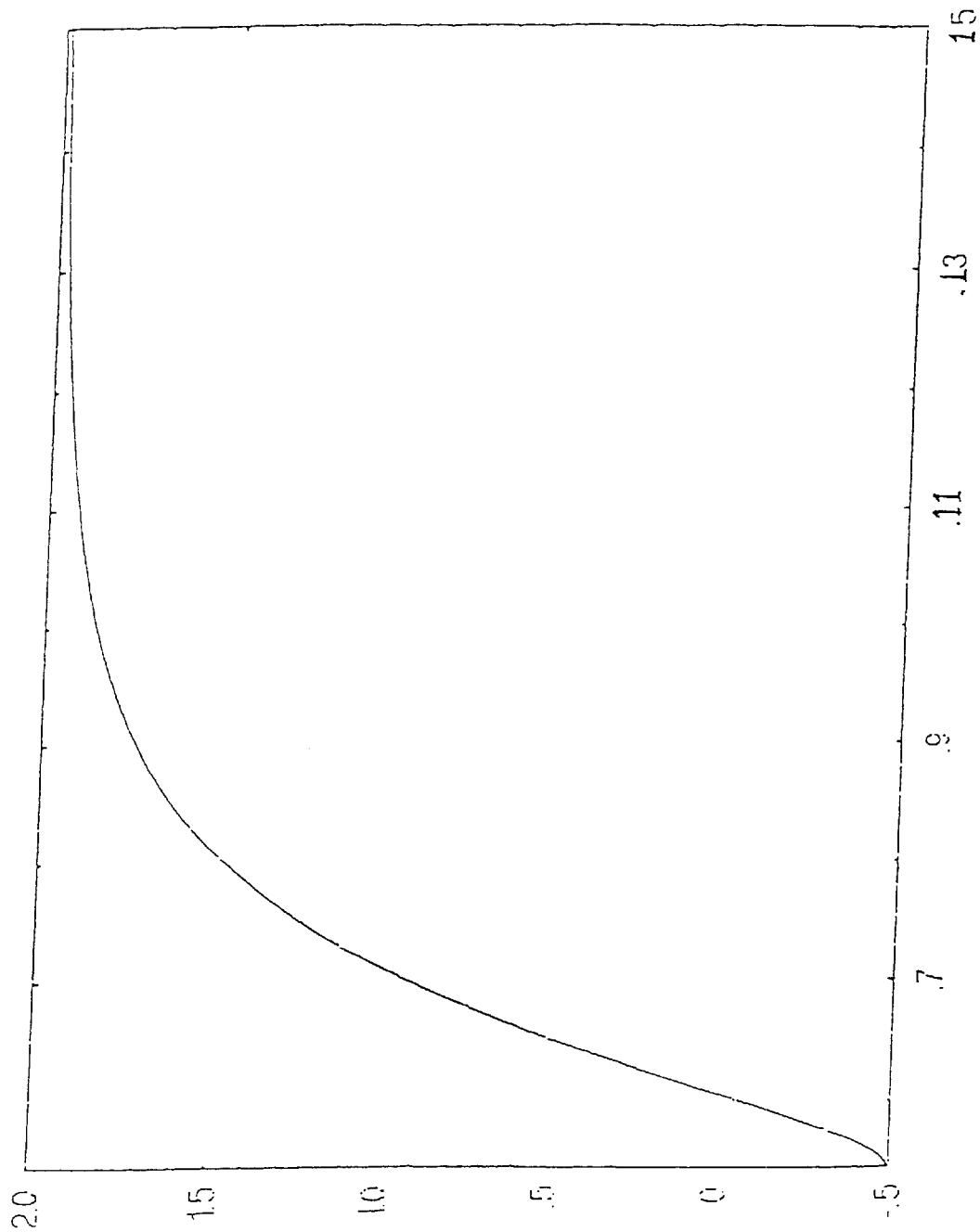
FIG. 8 is a plot of ratio of expectation values of real and imaginary components against distance for an inverse cube field.

By way of further example, a plot of ratio of the quadrature components produced by detector 15 against distance is plotted in FIG. 8 for a field which varies according to an inverse cube law in the vicinity of a localised sample. Note that this curve is effectively obtained from that of FIG. 7 by inversion (low flip angles correspond to large distances) and expansion in the horizontal direction by a variable factor (the curve is compressed at points near to the coil, where the field strength changes rapidly with distance, and expanded further away from the coil, where the rate of change of field with distance is much lower). Thus, from this graph, an approximation appropriate to a probe comprising an Archimedean spiral, the distance of a crystal from the probe may be determined directly from the ratio of the components after simple calibration of the apparatus to take into account the size of the coil and any inherent phase delays.

The magnitude of the resulting signal gives an indication of the total number of nuclei present in the sample. For a more accurate indication, this should be adjusted to take into account variations in the exciting field strength at different positions in the sample. Where a transmitter coil 14 producing a field which diminishes with distance from the coil is also used as a receiver, account must be taken of the fact that the receiver will be correspondingly less sensitive to signals originating from further away; this will be true in most practical applications. As discussed above, adjustment may be achieved by storing data relating to the variation of field and receiver sensitivity with position and scaling the amplitude data according to the position from which it originates.

From the quantity and positional information, a profile of the distribution of responsive nuclei can be obtained.

The resonance frequency of a nucleus is affected by the local environment, as is well known in the art. If variations in resonance frequency are measured (for example by repeating the experiment for a variety of exciting frequencies), an output of this information together with the positional information may provide a profile of variation of a factor such as temperature pressure or stress which affects the resonance frequency. It will be apparent that this may be useful in thermal or stress analysis.

Experimental Results for $^{14}$N NQR in RDX—Single Cluster of Nuclei

Figure 9:
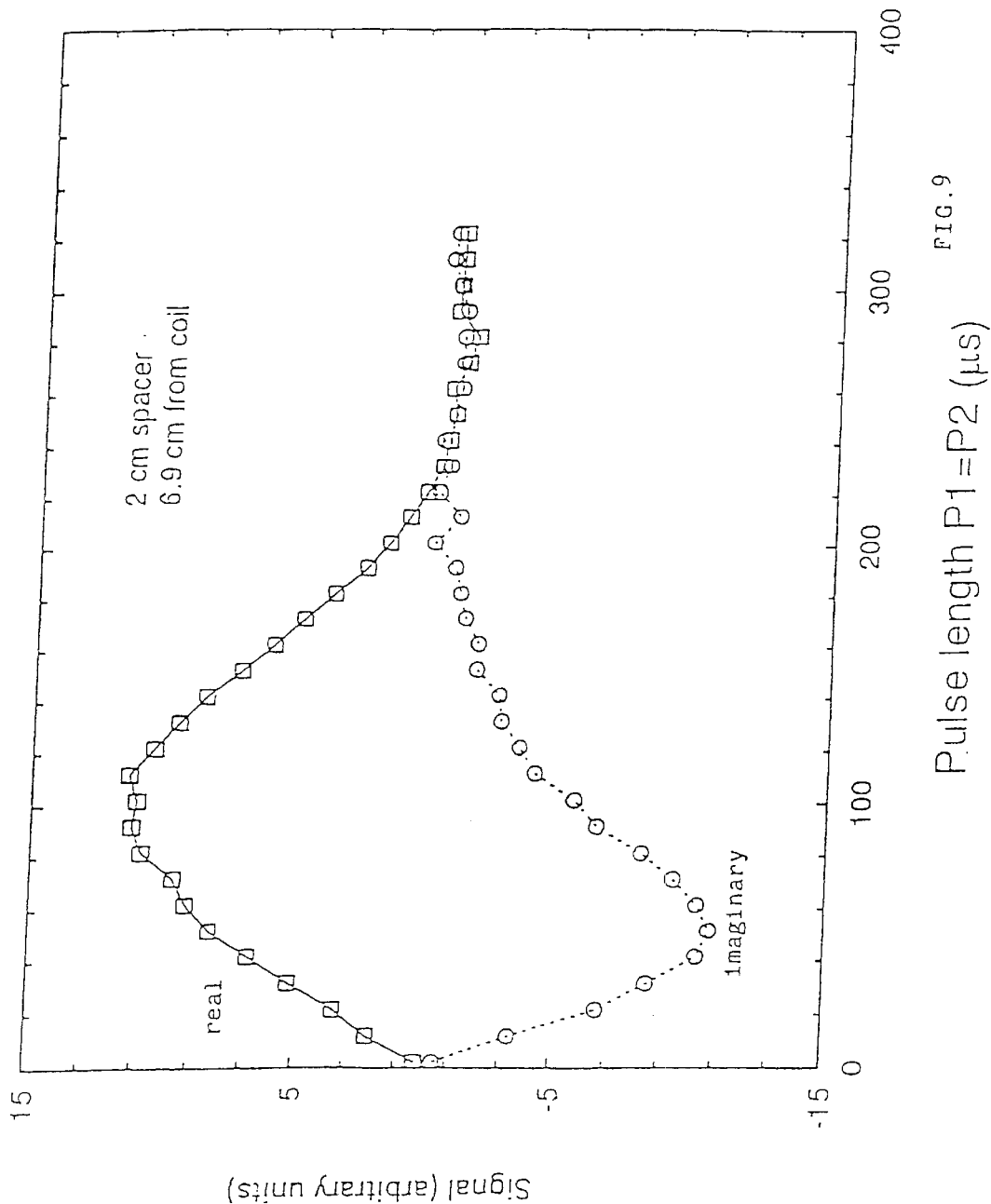
FIG. 9 is a plot of results obtained from a 200 g sample of RDX located 6.9 cm from a 25 cm diameter spiral coil when excited at 5.1927 MHz.
Figure 10:
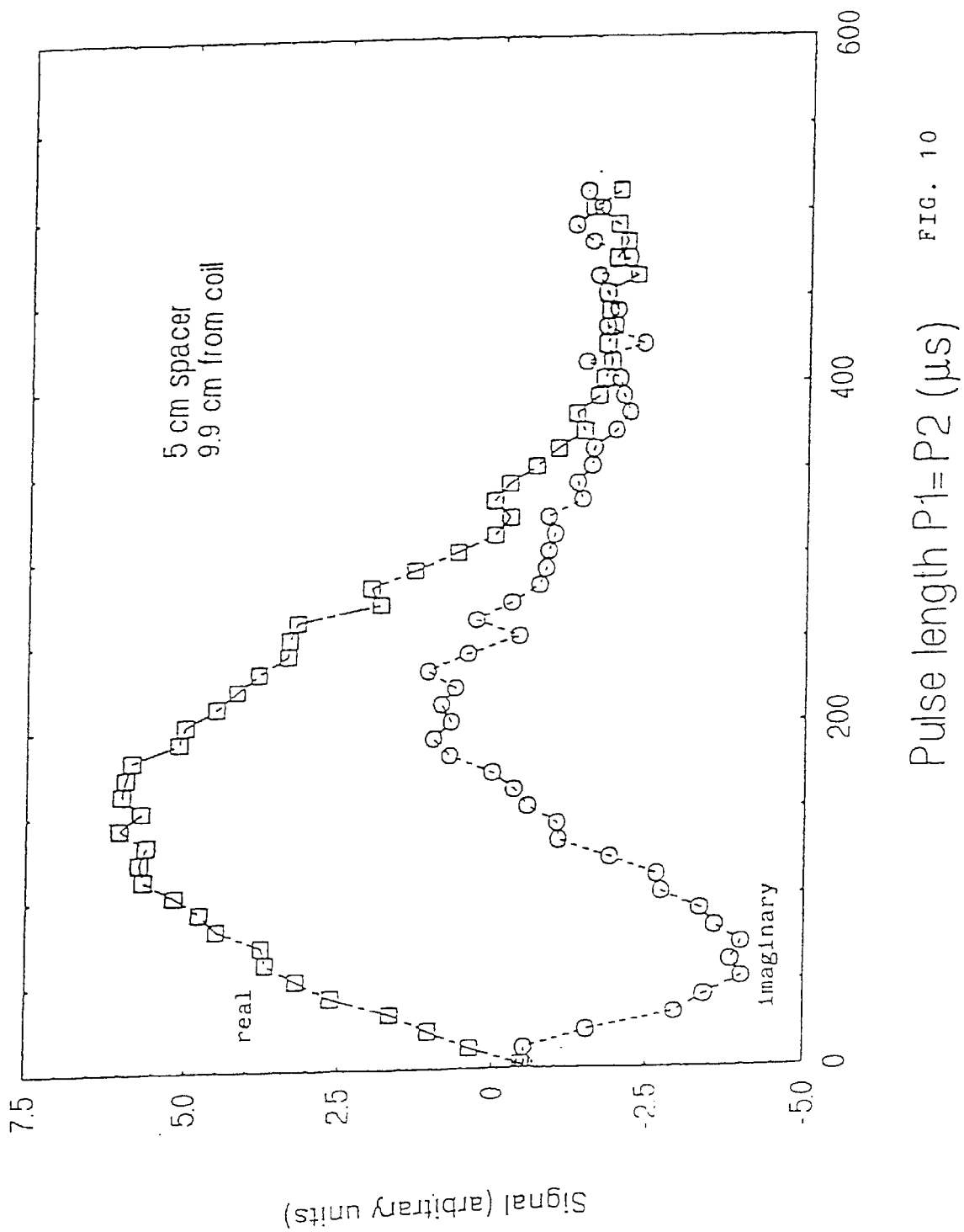
FIG. 10 is a plot of results obtained from the same sample as in FIG. 9 at a distance of 9.9 cm from the coil.
Figure 11:
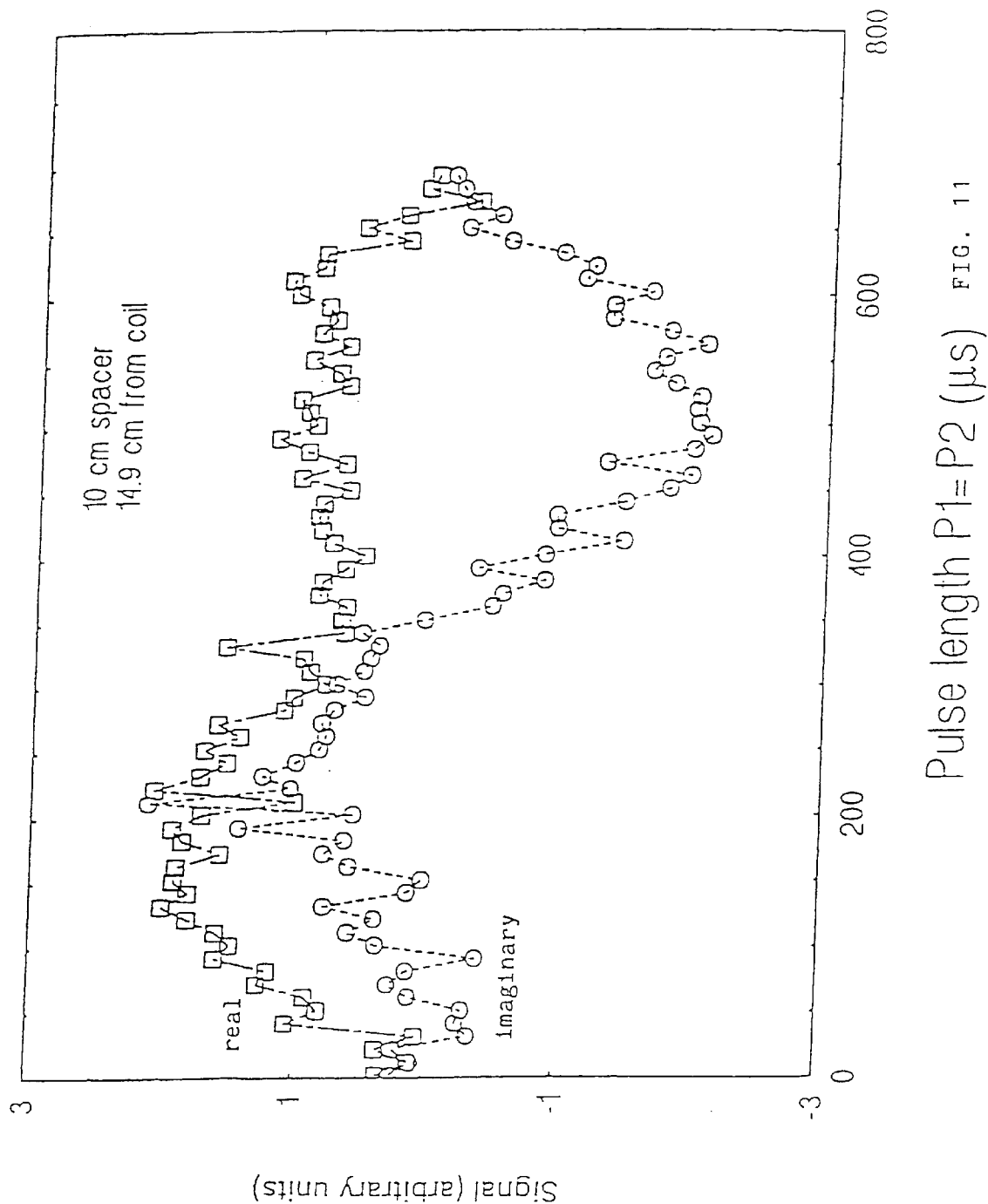
FIG. 11 is a plot of results obtained from the same sample as in FIG. 9 at a distance of 14.9 cm from the coil.

Turning now to some experimental data, FIGS. 9–11 show the real and imaginary components obtained for single 200 g polycrystalline samples of RDX centred at distances of 6.9, 9.9, and 14.9 cm respectively from a 25 cm diameter spiral coil (with spacers of 2, 5, and 10 cm respectively); these results were obtained using the spiral coil of the embodiment of FIG. 1A to excite the sample. On resonance pulses of equal length with a phase shift of 90 degrees were used, and the 5.19 MHz line was observed.

Firstly, it can be seen that at greater distances from the coil (corresponding to lower field strength), a maximum amplitude occurs at longer pulse lengths, since at lower field strengths, the flip angle varies more slowly with variation in pulse length. This dependence of the pulse length for maximum amplitude on position is the basis for the method of Rommel et al. discussed above.

With the plot of real and imaginary components, it can also be seen that for a given pulse length (e.g. 100 $\mu$s) the relative sizes of the real and imaginary components are different for each position, thus the phase will also be different for each position of the sample, as explained above, so the position of a single sample may be determined from the phase of the signal.

Figure 12:
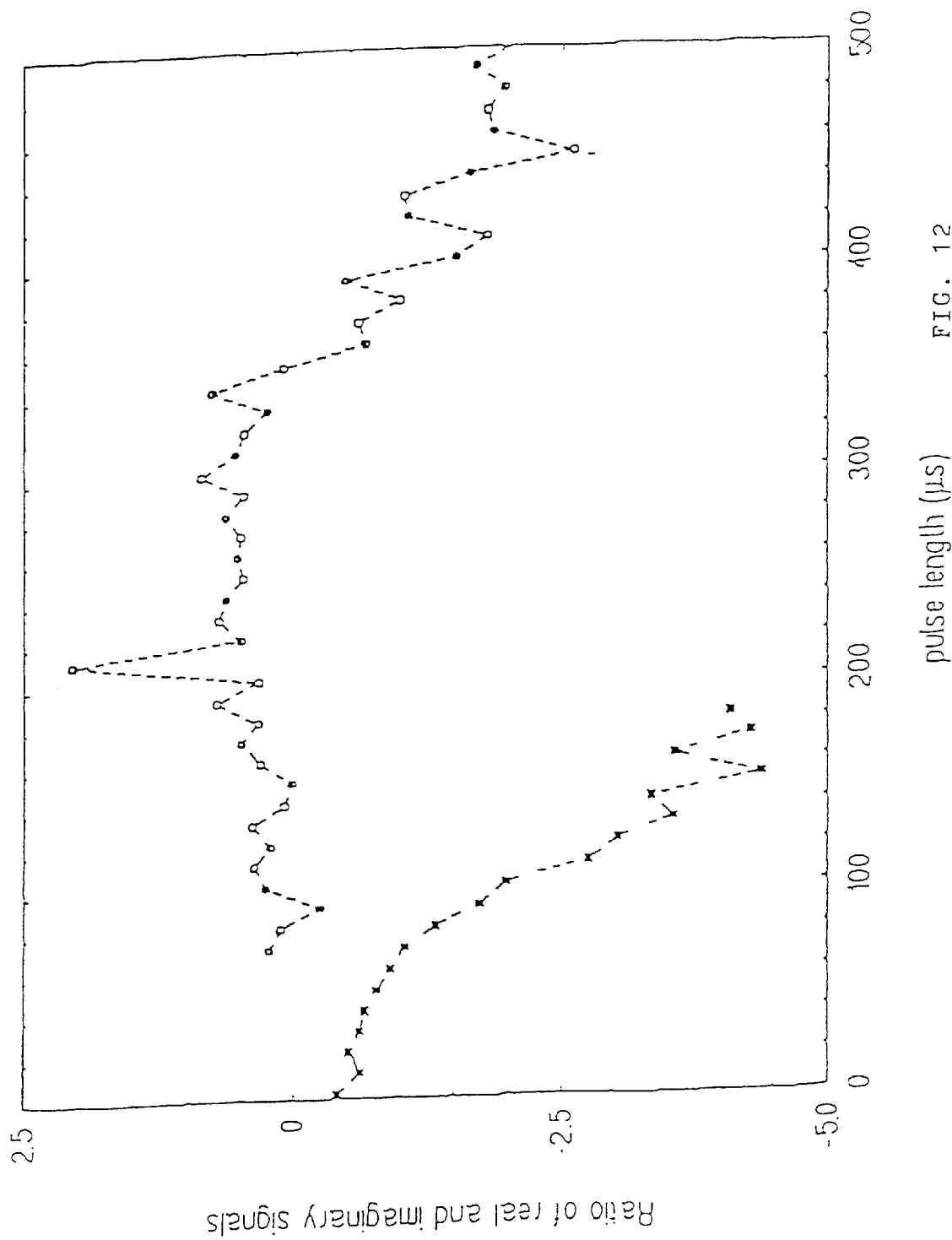
FIG. 12 is a plot of the ratio of real and imaginary components from the results of FIG. 9 (square boxes) and FIG. 11 (circles) respectively.

Referring now to FIG. 12, a phase parameter (ratio of real and imaginary components) is plotted as a function of pulse length for samples at two distances from a spiral coil; the square points correspond to the data of FIG. 9 and the circles correspond to the data of FIG. 11. The phase parameter has not been corrected to take into account phase delays in the apparatus (this is discussed below). Nor has it been filtered or repeated to reduce the effect of noise, or to take into account the diminished signal magnitude obtained from the sample further away. Nevertheless, it can clearly be seen that the curves exhibit a phase dependence generally similar to that predicted in FIG. 7.

Concentrating first on the square data points, it will be seen that the ratio of the real and imaginary components changes smoothly up to a pulse width of approximately 150 micro seconds. Referring now to the circular data points, it will be seen that there is little change in the phase parameter until a pulse length of about 350 micro seconds; this is because the sample is further from the spiral coil, so the field is correspondingly smaller and hence the flip angles (proportional to the product of field and duration) are small. It will be appreciated that where one component has a small magnitude (e.g. at low flip angles), the effect of noise will be greater.

It may be seen that the traces obtained do not correspond exactly to those discussed above. This can be attributed to a phase delay in the apparatus (for example in the power amplifier or detector). The phase delay results in the measured real and imaginary components being related to the "theoretical" real and imaginary components according to the well-known equation for rotation in the complex plane by a phase angle $\beta$ equal to the net phase-shift in the apparatus. That is, if the "theoretical" components are x+jy, the observed components x'+jy' should be given by the equation x'+jy'=(x+jy)(cos$\beta$+jsin$\beta$). The phase-shift for a given apparatus can be determined empirically and the data transformed before calculation is performed, or it can be taken into account in the calculation. Alternatively, the phase offset for the apparatus can be determined by comparing the measured and predicted response signals for a variety of flip angles. In the majority of results presented herein, the phase of the apparatus was pre-set by performing an initial experiment with a nominal 90° pulse and adjusting a variable delay inserted in the signal path to the quadrature detector to give a maximum value for the real component.

It will be understood that if the flip angles in the sample lie in the range of 0 to 2$\pi$, the measured phase (i.e. including the phase shift) should still be a single-valued function of flip angle (and hence position) but will be offset from that depicted in FIG. 6, and may not be monotonically increasing or decreasing.

It will be apparent that for typical frequencies used (a few MHz), the signal wavelength will be of the order of a hundred meters, and so unless the sample is very large, the phase shift can be assumed to be constant throughout the sample; adjustment of measured phase shifts taking into account phase shifts due to propagation delays may be made if desired.

In the above experiment, a large number of pulse lengths were used for a relatively small number of sample distances from the coil, to demonstrate the effect of flip angle on phase of the received signal. This was for experimental convenience; it is easier to produce consistent results rapidly if pulse length is varied than if the sample is physically moved. As discussed above, particularly with reference to FIG. 8, similar results would be expected if phase parameter were plotted against distance; effectively the curve of FIG. 12 would be stretched in the x-direction by a variable factor dependent on the field pattern produced by the coil.

It will be appreciated that for a known coil field pattern, the distance of one object from the coil can in principle be determined from excitation with a pair of pulses. In practice, to compensate for the effects of noise, and to extend the useful range of distances, it is desirable to adjust one or more of the field strength and pulse duration so that the measured phase parameter can provide an accurate indication of position. For example, referring to the square data points in FIG. 12, and using the same field strength, a pulse length of 80–100 microseconds would be appropriate as this would lie on a region of the curve in which phase changes predictably and smoothly with distance; for the circle data points, a longer pulse length would be better and/or (more preferably) a higher field strength (e.g. about 5–10 times the amplitude) would be used to reduce noise.

A more accurate determination can be made by measuring the phase parameter for a number of pulse durations and preferably for several field strengths, and then fitting the resulting data to an appropriate curve; this will reduce the effect of spurious measurements. The resolution will increase as more pulse durations are selected.

It will be appreciated that many variations of this method may be used to obtain effective position determination over a range of distances; for example an initial series of measurements may be taken to determine an approximate position for a sample, and then further measurements may be taken to refine the position determination.

Thus, it can be seen that the data encodes the position of a sample with respect to the coil. This data can be processed in a number of ways, depending on the results required. Two methods which can conveniently be used to obtain an image from the data will now be described.

First Image Derivation Method—Best Fit Method

One way in which an image or other representation of the sample can be obtained from the data is by fitting the experimentally acquired data to a theoretical prediction of data to be expected for a particular distribution. The basic scheme for performing the method is:

1 Acquire data from real sample.
2 Initialise variables controlling model (for example depth of cluster, width of cluster).
3 Predict results expected for model.
4 Compare predicted to actual results.
5 Vary model parameters.
6 Repeat steps 3 to 5.

The first 3 steps may be performed in any order. The repetition is performed until the desired resolution is obtained. Comparison may be performed by visual matching of data, but is best performed numerically, for example by use of a $\chi^2$ test. This technique is best suited to generation of a simple image, or where the sample is expected to have certain properties corresponding closely to a relatively simple model. A particular use is in the determinination of the position and approximate size of a single cluster of material, for example in the screening of luggage for explosive, or the detection of underground explosives. However, if the data is acquired with a sufficient signal to noise ratio, complex models can be fitted to the data.

In more detail, the model may be predicted by assuming that the real component varies as a function of $J(\alpha)$ and the imaginary component as a function of $J(2\alpha)$, where $\alpha$ is the flip angle. The flip angle may be assumed to have a particular dependence on distance from the coil, for example inverse cubic, or may be based on an empirical determination. The model is preferably calibrated, by reference to known samples.

Where a calculation is performed assuming a relatively uniform sample of a given thickness at a certain distance from the coil, it is preferred to vary the assumed distance first to obtain an approximate fit, and then vary the assumed thickness, and then if necessary to adjust the depth; this provides an efficient means of localising a sample rapidly and reliably.

Referring to FIG. 16, a comparison of predicted results with actual results obtained from a 6 cm wide sample of RDX 7 cm from a coil are shown. In the plots, the dash-dot line represents the measured real component, the short dashed line represents the measured imaginary component, the dashed line represents the predicted imaginary component, and the dash-dot-dot line (or in FIGS. 16c and 16d, the long dashed line) represents the predicted real component.

Figure 16A:
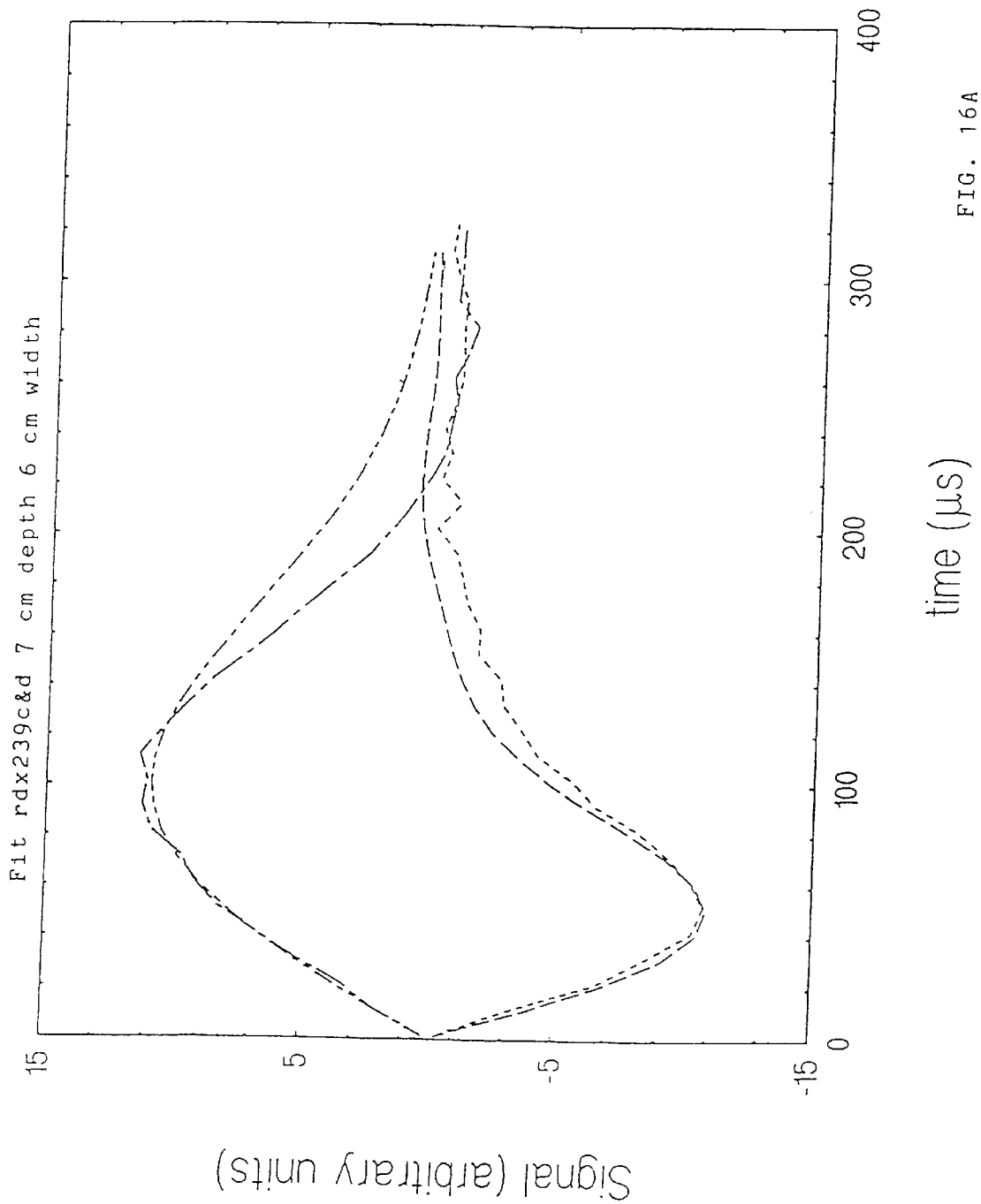
FIG. 16 is a series of plots showing data obtained from a sample 6 cm wide at a distance of 7 cm from a coil compared to a series of predicted results for different sample sizes and distances.
Figure 16B:
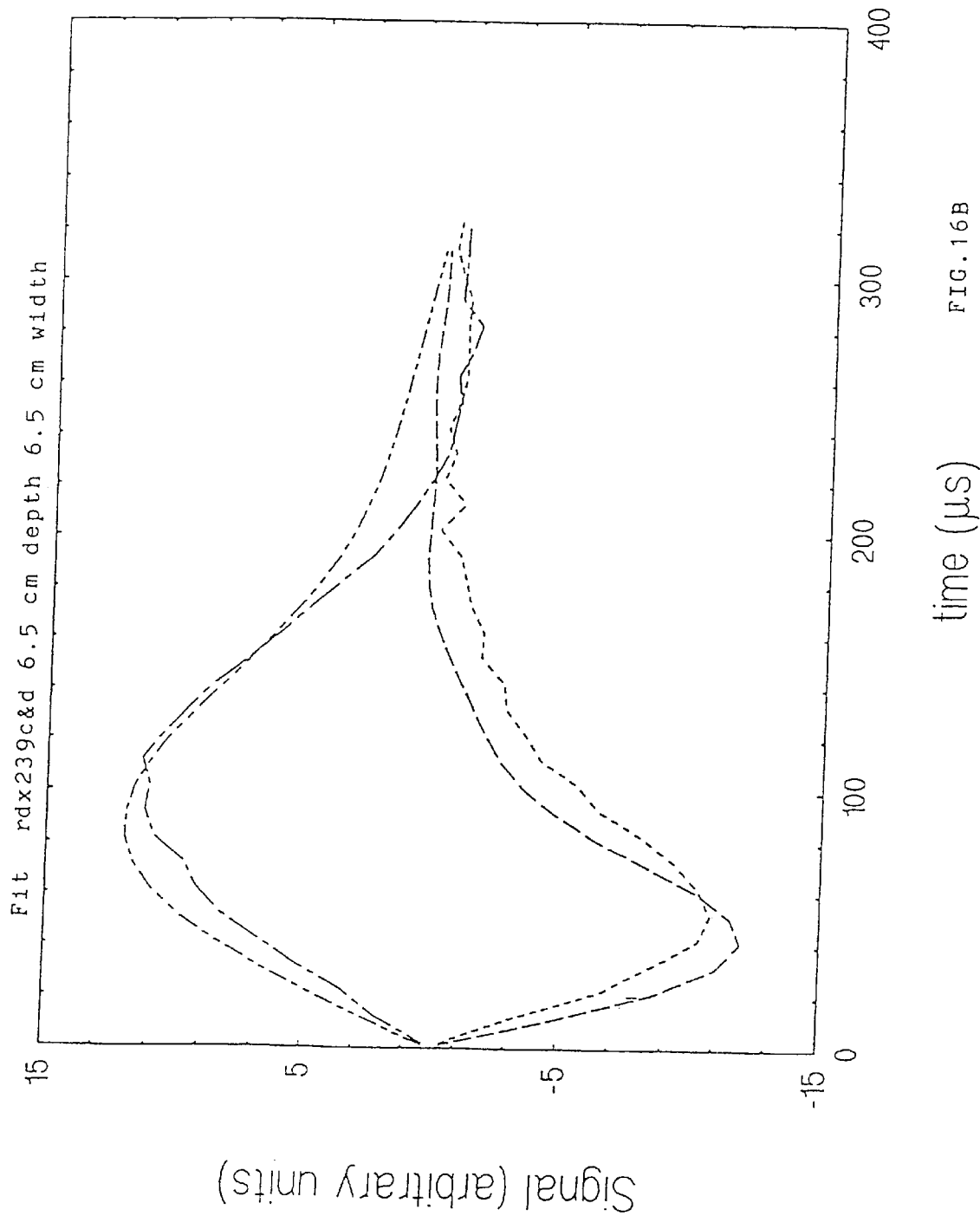
Figure 16C:
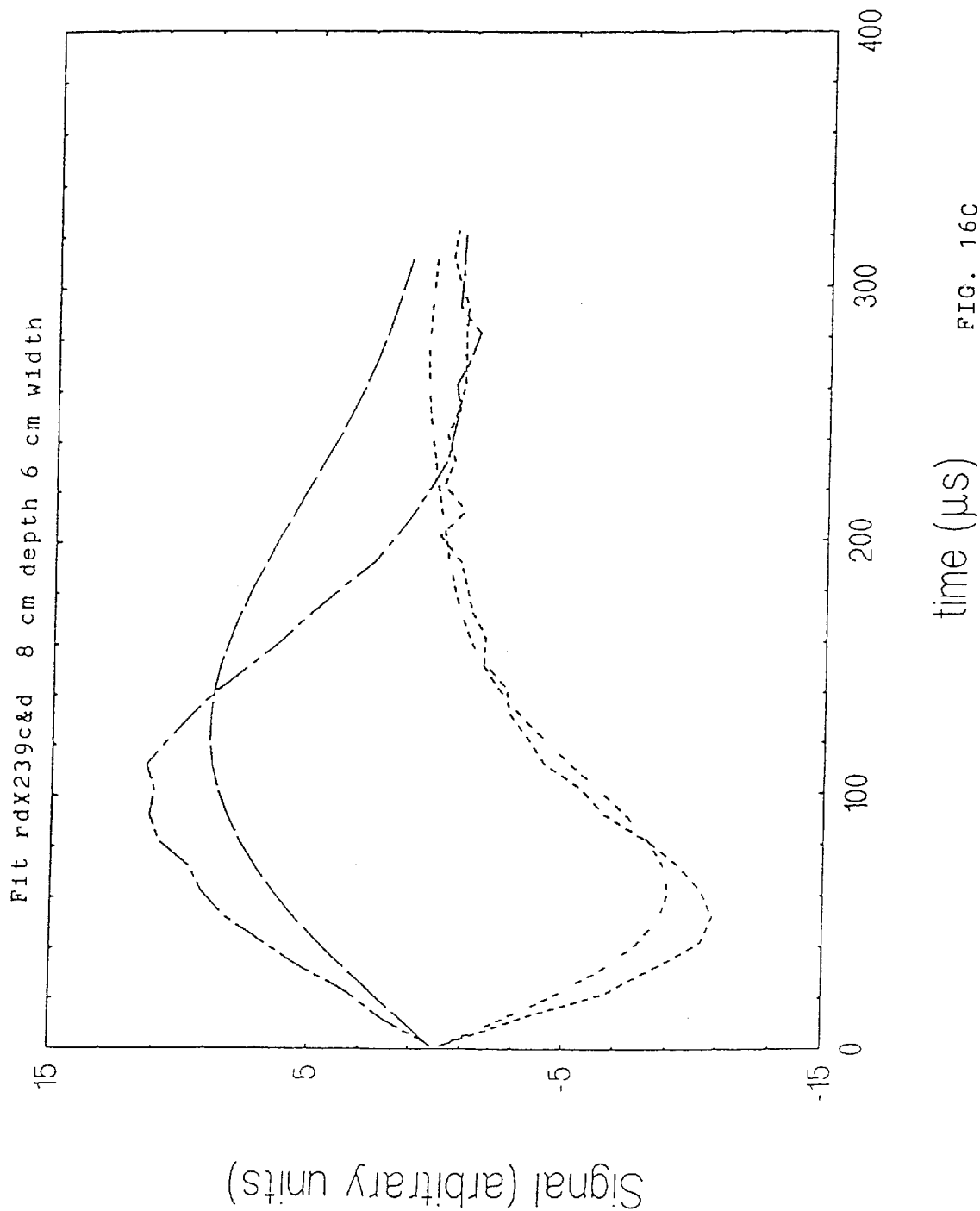
Figure 16D:
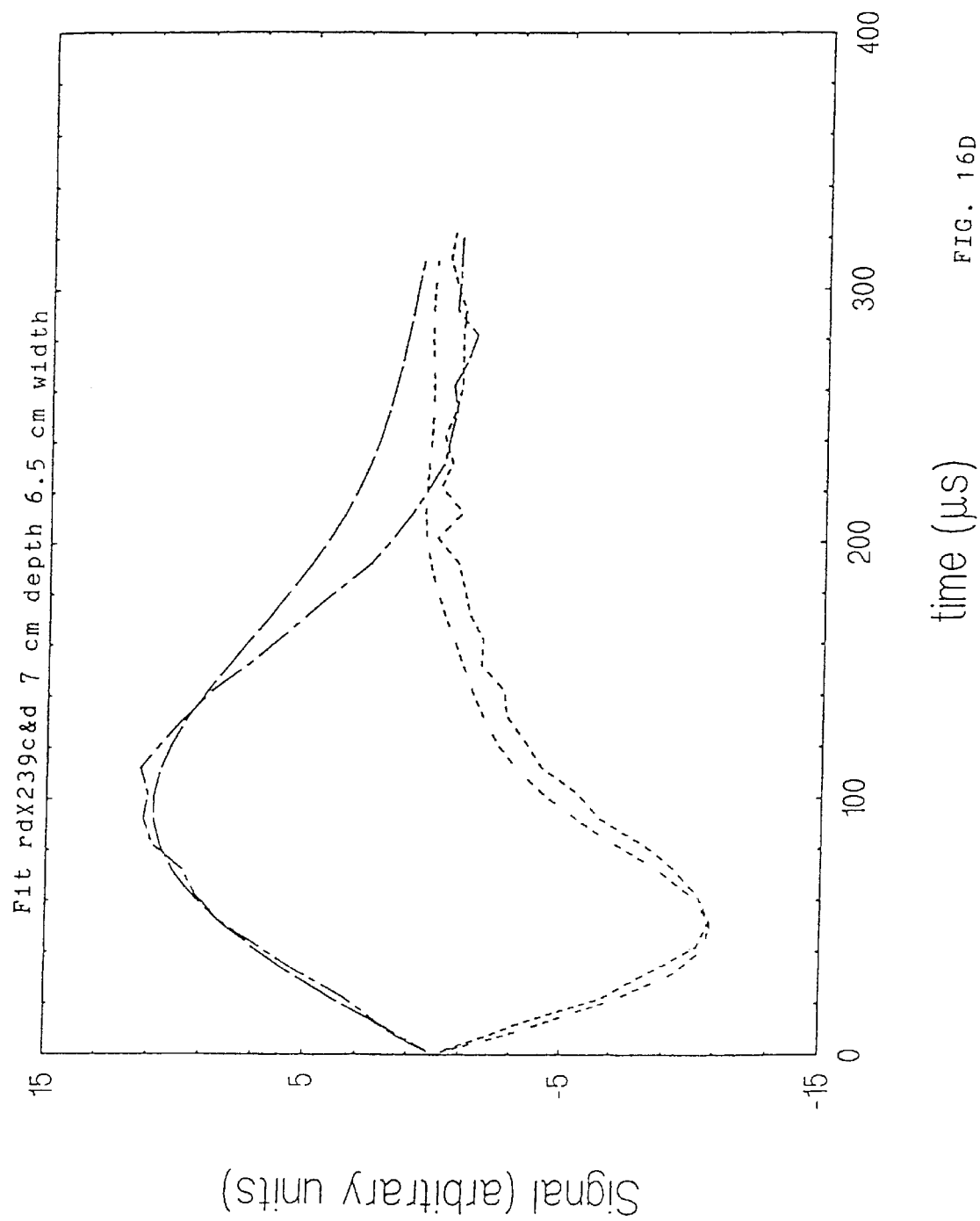

As can be seen, a good fit is obtained when the model parameters are correct, as in FIG. 16a. When a small change is made in the predicted distance (to 6.5 cm or 8 cm), the fit becomes noticeably less good quite rapidly, as can be seen in FIGS. 16b and 16c. However, as can be seen from FIG. 16d, it is less easy, though possible, to discern smaller changes in sample size by visual matching of curves.

Figure 17:
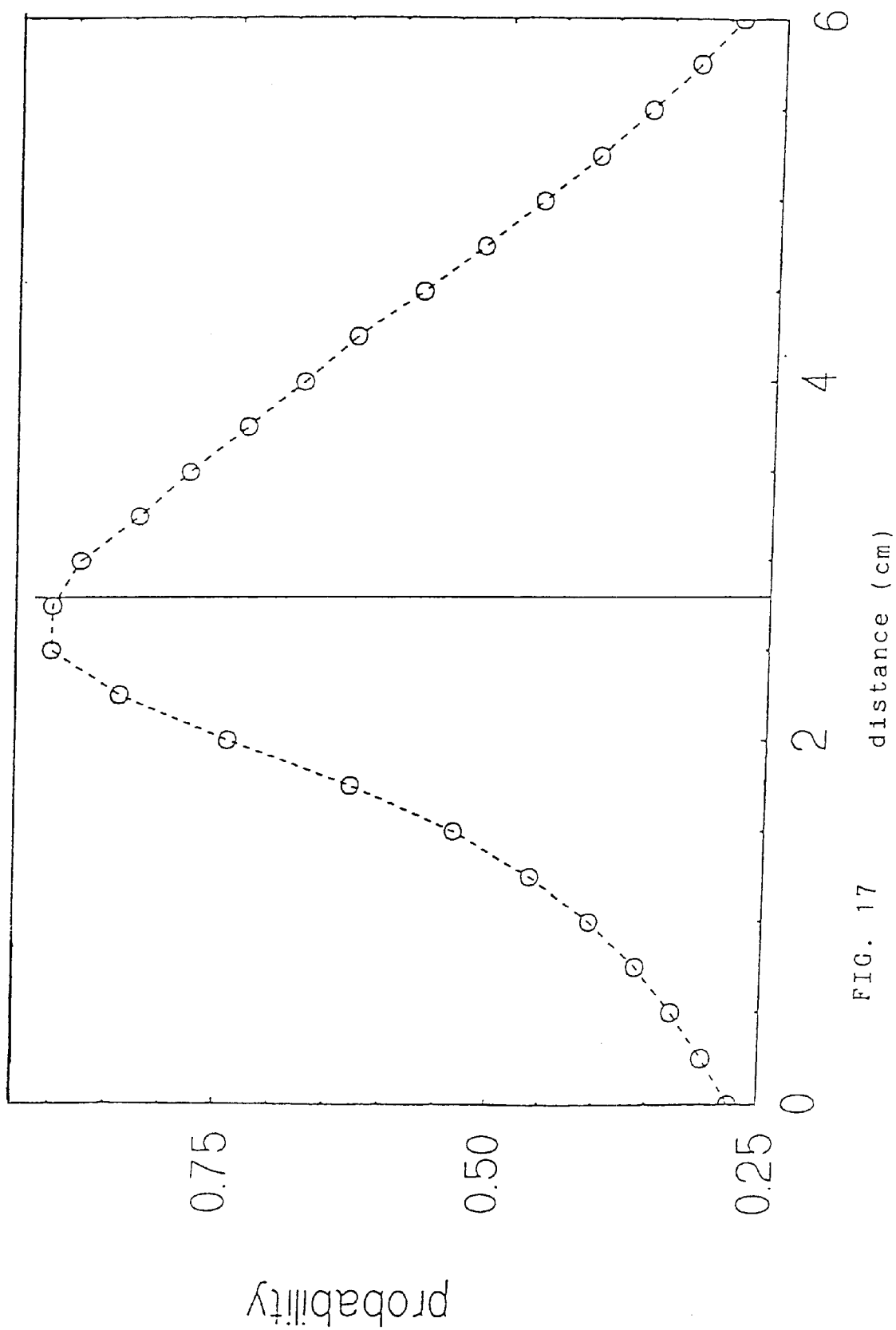
FIG. 17 is a plot of the probability of a sample being located at a particular distance from a coil based on comparison of data obtained from a sample 2.7 cm from a coil to a theoretical prediction.

Thus, the fitting is preferably performed numerically. A measure of the goodness of fit plotted as a function of one or more model parameters such as distance can be plotted. Alternatively, a numerical output of the most likely sample size and dimensions can be produced. FIG. 17 shows the results obtained by performing a chi-squared fit of the measured to the predicted data and plotting probability ($1/\chi^2$) against distance for a sample located 2.7 cm from a coil; a clear peak can be seen at the "correct" distance.

As will be appreciated, the above one-dimensional experiments can be performed along three orthogonal directions and an image formed by projection-reconstruction, or an image can be formed by moving the sample with respect to the image.

Second Image Derivation Method—Fourier Transform

As mentioned above, the first method is best suited to generation of images of simple samples. There will now be described a method which has been successfully used to resolve multiple clusters of nuclei.

Following the procedure of Rommel et al (Meas. Sci Technol; 1991, 2, 866–871, incorporrated herein by reference), a double Fourier transform is performed with respect to the FID time t and the "pseudo-FID" time (or pulse length) tp. After the first, on resonance, we have the equivalent of Rommel's equation (5) as $$S(\omega, t_p) = e^{-\frac{(\omega-\omega_\phi)^2}{2\delta}} \int_{-\infty}^{\infty} \rho(z) M(t_p, z) \, dz \qquad (1)$$

in which p(z) is the number density of resonating nuclei and $\delta$ is the NQR line second moment. Following the explanation presented above, the magnetisation $M(t_p,z)$ can be written as $$M(t_p, z) = x(t_p, z) + iy(t_p, z) \qquad (2)$$

$$= J(\alpha) + iJ(2\alpha)$$

where $$\alpha = 2\gamma B_1 t p = 2\gamma G_z z t_p \qquad (3)$$

in a linear $B_1$ gradient of $G_z$. Hence equation (1) can be written as (omitting constant terms)

$$S(\omega, t_p) = \int_{-\infty}^{\infty} \rho(z) \{J(\alpha) + iJ(2\alpha)\} dz \qquad (4)$$

Under certain conditions, Rommel et al show that the Bessel function $(J\alpha)$ can be written as $$J_1(\alpha) = \sqrt{\frac{2}{\pi\alpha}} \sin\left(\alpha - \frac{\pi}{4}\right) + O(\alpha^{-1}) \qquad (5)$$

Combining equations (4) and (5) and performing a second Fourier transform with respect to $t_p$, or in k component space, $k_z$, where $$k_z = 2\gamma G_z t_p \qquad (6)$$

gives us the profile $\rho(z)$ $$\rho(z) = F_k\{S(\omega, k_z)\} \qquad (7)$$

to a reasonable approximation. The distance dependence of the sensitivity $\sigma(z)$ then gives us the true or corrected profile.

$$\rho(z)_{corr} = \rho(z)/\sigma(z) \qquad (8)$$

In a two-dimensional representation, the profile information is presented along the $td^{-1}$ (or $K_z^{-1}$) axis and spectroscopic information along the $t^{-1}$ axis, so that more than one NQR transition can be imaged at the same time.

Figure 14:
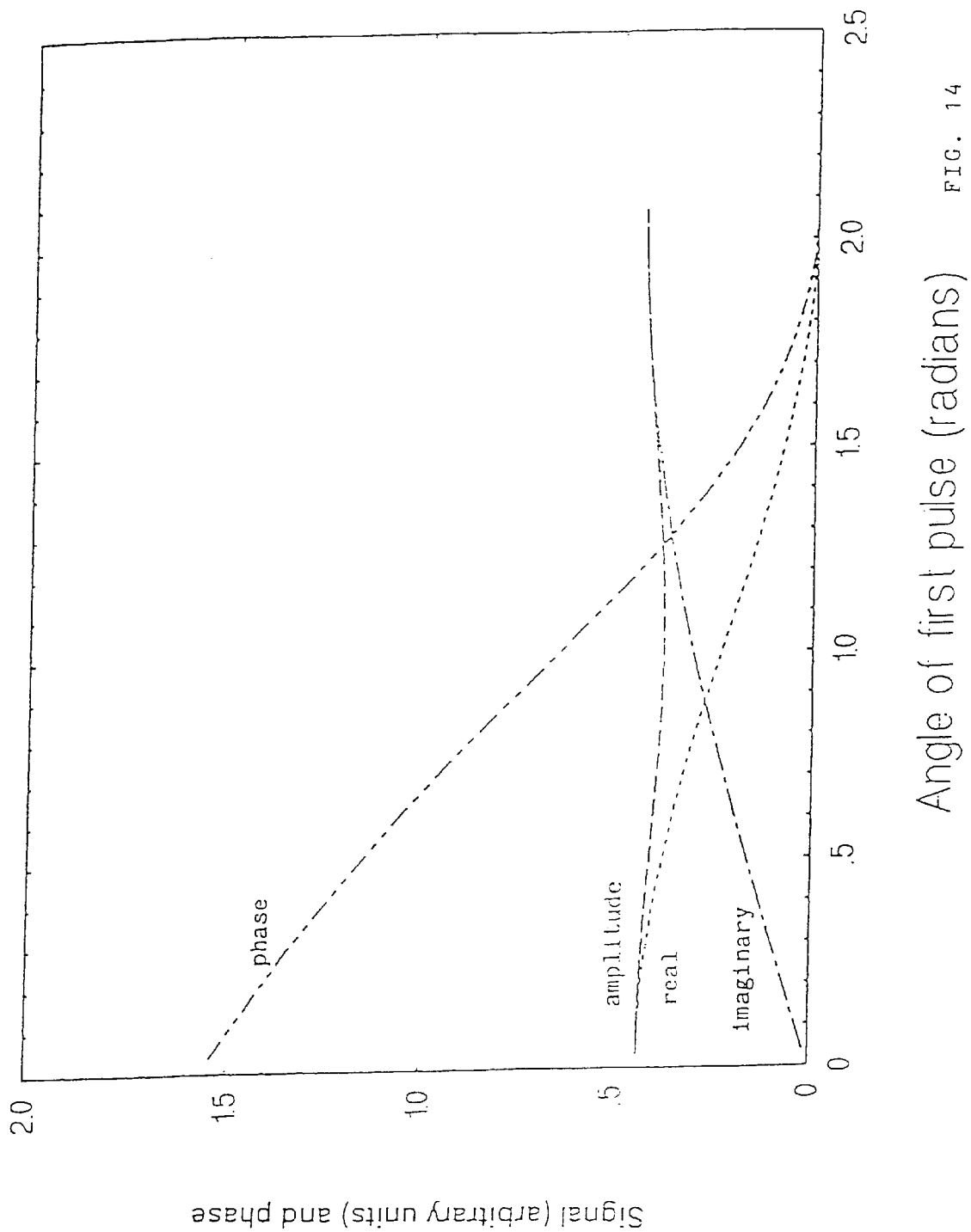
FIG. 14 is a plot of real and imaginary components and phase for two pulses of constant total flip angle, but differing lengths against the flip angle produced by the first pulse.

The use of both phase and amplitude information in the spectrum means that the method presented here has a higher sensitivity than the amplitude encoding technique of Rommel et al. FIG. 6 shows that the magnitude of the magnetisation is largely independent of $\alpha$ for $\alpha>0.5$ (below this value, an additional correction will need to be made). This is even less of an approximation for the pulse sequence used in the results presented in FIG. 14, in which the overall pulse length was constant, so that the width of one pulse is increased by as much as the other is diminished.

In outline one scheme for performing the method is:
1. Acquire a set of time domain data for a starting value of pulse length, $t_p$
2. Increment the pulse length and repeat step 1 to obtain an array of data for a series of values of $t_p$
3. Fourier transform the data with respect to time to obtain a set of frequency domain data for each value of $t_p$
4. Fourier transform the data with respect to $t_p$ to obtain pseudo FID data; the transformed $t_p$ axis will now correspond to a function of distance
5. Select a line of data at a desired value of frequency (for example a resonant frequency of the nuclei); this will correspond to a profile $\rho$
6. Scale the transformed $t_p$ axis to correspond to distance from the coil (based on equation 6 above, and preferably employing empirical calibration)
7. Correct the height of the curve based on the sensitivity of the coil as a function of distance.

Figure 18:
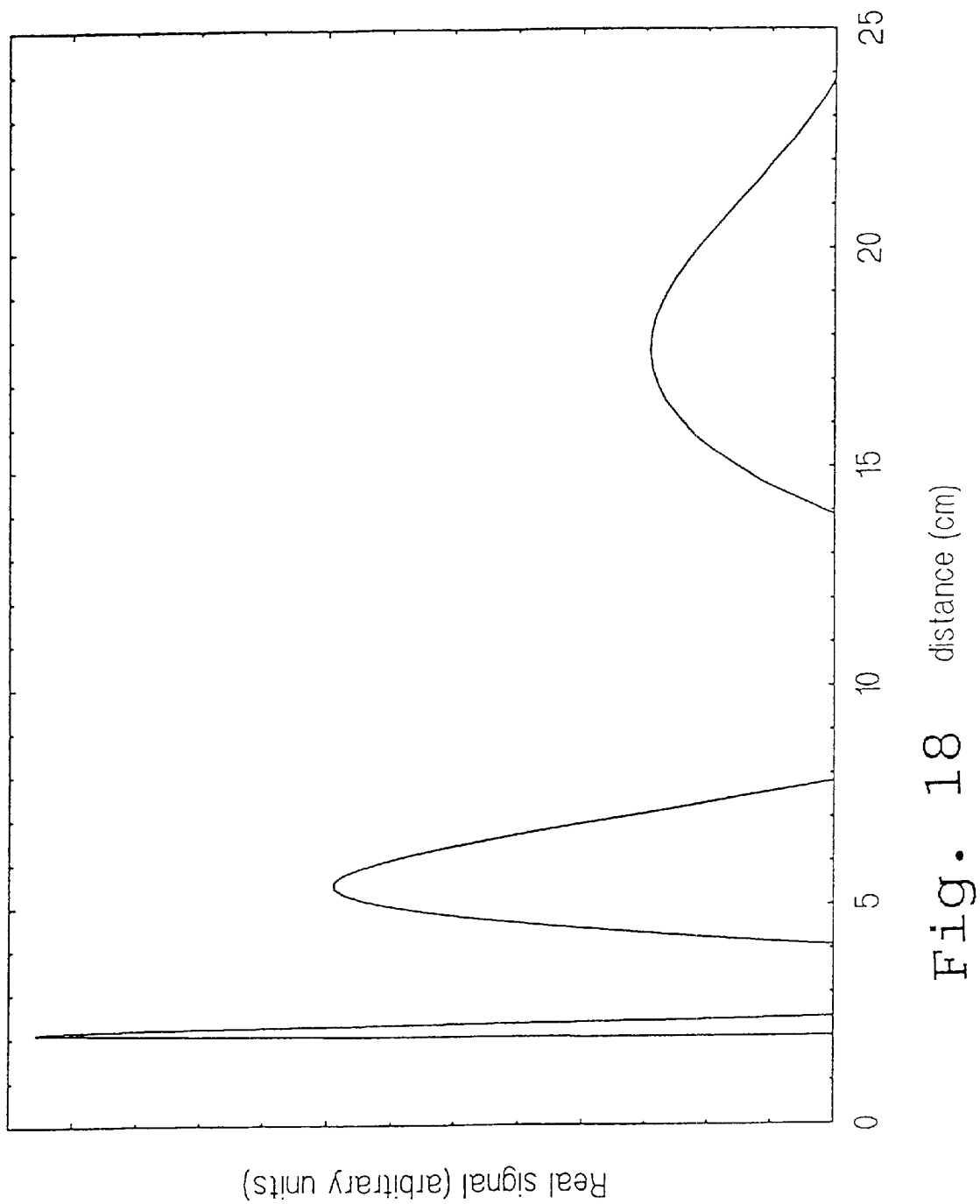
FIG. 18 is a plot of a profile obtained from three samples of RDX at distances of 2, 7, and 16.5 cm from a coil respectively.

FIG. 18 shows the results of performing the above method for three samples at distances of approximately 2, 7 and 16.5 cm from the coil. The distance axis has been scaled based on empirical calculation, and the positive portion of the real component of the profile $\rho$ has been taken plotted, which represents a measure of the amount of material.

In the above described experiment, the pulse durations were equal and the field strength and pattern were kept constant, and Fourier transforms were used. Fourier transforms are only an approximation; better results may be achieved by using Hankel transforms (using a series of Bessel functions in place of sine waves), or by using a Maximum Entropy Method. These latter methods are somewhat more computationally intensive, but can readily be performed without unacceptable delay on, for example, a standard PC with a 200 MHz processor.

Analogous results may be obtained by varying pulse magnitude in place of flip angle. It is also possible for multiple sets of data to be collected with different field patterns, and for the different results to be combined, to obtain optimum resolution throughout a large sample. As will be understood from the above, the approximation that the $B_1$ field has a linear gradient $G_z$ will have to be adjusted to take into account the variation of $B_1$ with distance.

It is not necessary for both excitation pulse durations to be equal, although this may simplify data processing. If the relative pulse durations vary, more complex processing can be performed, using a further parameter, such as the ratio of pulse durations, or separate parameters for each pulse duration. In place of selecting a single frequency and plotting the profile at that frequency, a three-dimensional plot may be produced; this will show variation of frequency with position, and may be used, for example, in obtaining a measure of temperature distribution within a sample.

In both cases a two-dimensional image may be built either by the use of two orthogonal surface coils, or by performing the discrete Fourier transform (7) along a series of z-directions obtained either by stepwise rotation of the sample about an axis perpendicular to z, or by a similar motion of the antenna, as already described above.

The above discussion has concentrated on the use of a single spiral coil to transmit and receive signals. The spiral coil, as mentioned, produces a field diminishing according to an inverse cube law. This results in a large field near the coil which rapidly becomes very small. A potential problem with this is that, if it is desired to probe samples far away from the coil with a high signal to noise ratio, a very large field near the coil is required, which can require costly high power amplifiers, and may result in excessive power being dissipated in objects nearer to the coil.

Although the results obtained show that a single coil may be satisfactory for many applications, it will be recalled that the probe 14 of the embodiment of FIG. 1A has 2 coils, a spiral coil and a Helmholtz pair (variants have other coils).

A solution to the above-mentioned potential problem is to apply a proportion of the r. f. signal to the Helmholtz pair. This raises the minimum field strength, and so the field strength required from the spiral coil is reduced. By appropriate selection of the proportions, a desired field pattern can be attained in a region of interest of the sample. For example, the field pattern may be set so that throughout the physical space accessible between the coils, the phase parameter varies smoothly between readily measurable limits for a given pulse length.

Referring back to the imaging method of Rommel et al discussed above, it will be recalled that positional information was obtained by fitting the amplitude data to a Bessel function. It is clear that fitting data to a Bessel function, which has an ill-defined peak, is both more mathematically intensive and likely to be less precise than simply determining a phase parameter and cross-referencing this to an appropriate distance, based on a graph or look-up table appropriate to the pulse lengths and field strengths employed for the coil used. However, an indication of the position of responsive nuclei may be determined based on the amplitude of the response signal by a method similar to Rommel's, and the results refined or adjusted by using an indication of the position based on the phase of the response signal.

It should be noted that neither this embodiment nor the invention as a whole are limited to determination of position itself; other positional parameters, for example including velocity, acceleration etc., may be measured. Where velocity is measured, the doppler shift in resonant frequency may also be taken into account.

Samples Containing Multiple Clusters—Processing Data

For ease of understanding, the above explanation has concentrated on the case of a single cluster of responsive nuclei. However, the technique can equally be applied to samples containing multiple clusters. Where there are two or more well-spaced clusters, as in the case of FIG. 12, it will be apparent that at short pulse lengths the cluster further from the coil will have little effect, and so the majority of the signal will be attributable to the cluster closer to the coil. Once the nearer cluster is identified, the effect of that cluster on the results can be compensated for to identify further clusters. By adjustment of field pattern, the excitation can be arranged so that distinct responses can be identified for each cluster; this is simple to implement, and works well for well-defined spaced clusters of nuclei.

Figure 13:
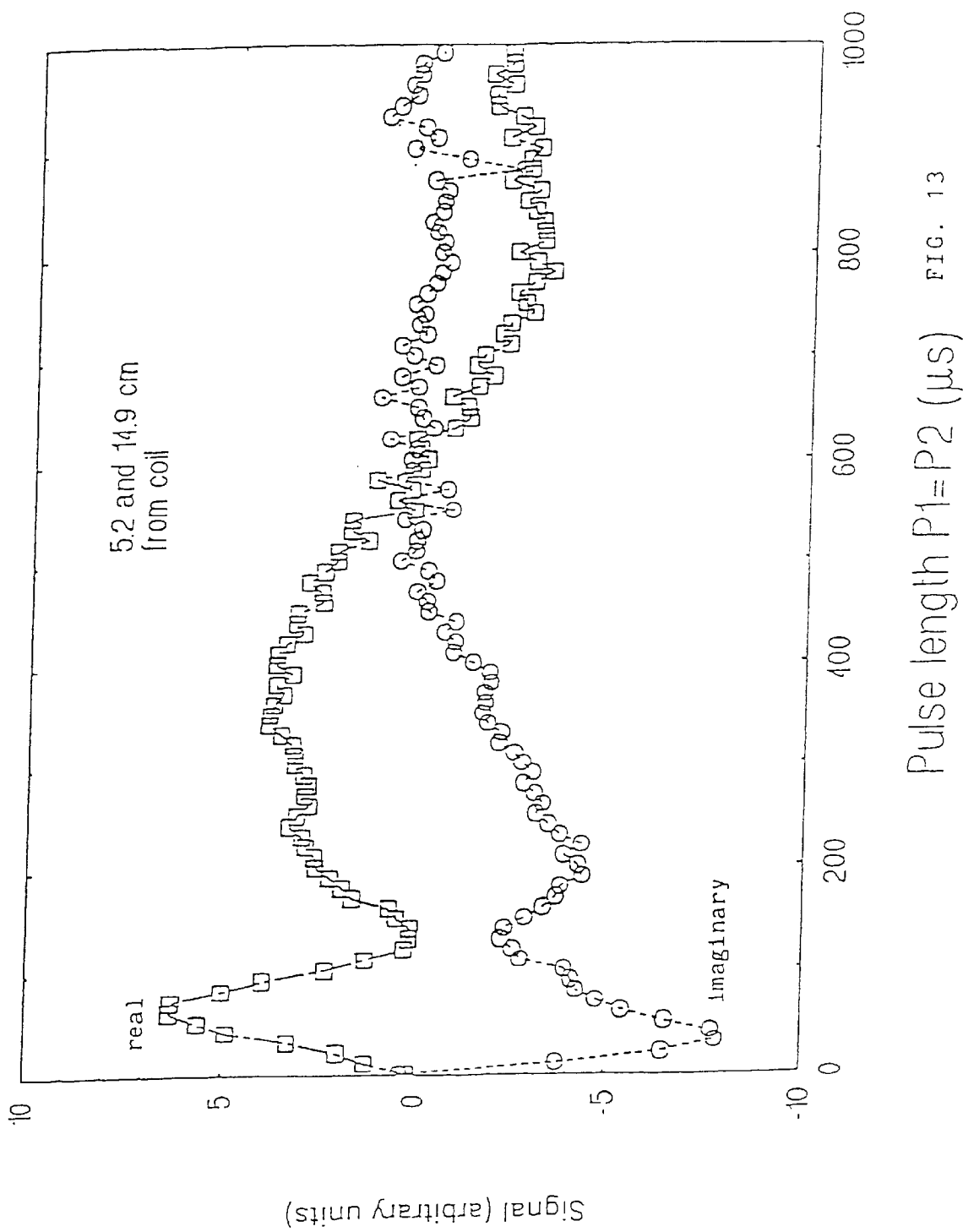
FIG. 13 is a plot of results obtained from a 32 g sample at a distance of 5.2 cm and a 200 g sample at a distance of 14.9 cm from the 25 cm diameter coil used to obtain the results of FIG. 9.

Referring to FIG. 13, which is a plot obtained from two samples, positioned at 5.2 and 14.9 cm respectively from the coil, two peaks can clearly be seen on the plot of real and imaginary components. By analysing this into a plot of amplitude as a function of phase, a distribution can be determined in which the two samples can be distinguished. To characterise the distribution better, which is particularly useful when investigating a sample containing many responsive nuclei at different positions, data are obtained for a variety of pulse lengths and/or field strengths.

In general, the greater the number of repetitions (with different pulse lengths or durations), the better will be the resolution attainable. It will be appreciated that for species which have an f.i.d. time of the order of a millisecond, 1000 repetitions can in principle be carried out in a few seconds; for substances which have much longer f.i.d. times, the number of repetitions will be a compromise between the time available for measurement and the resolution required.

It is common practice in NQR experiments to repeat each experiment a number of times (often several hundred times) and average the results to reduce noise. In cases where a number of pulse lengths or amplitudes are used, the measurements for each pulse length or amplitude may be repeated in addition to repeating the measurements for different pulse lengths or amplitudes. However, it will be appreciated that this may substantially increase the measurement time required; if 500 different pulse lengths are used, and each experiment is repeated 500 times, 250,000 experiments are required. To reduce the total number of experiments, experiments which initially produce data having a higher signal to noise ratio (for example at a large excitation amplitude) may be repeated less often than those which are more susceptible to noise (for example at a lower excitation amplitude). Noise can also be reduced by appropriate combination of data from experiments using different pulse lengths or amplitudes; for example if the processed data are plotted as points on a graph indicating quantity of nuclei at various positions, a smooth curve through the points will tend to reduce the effect of spurious data from individual points. Similar effects can, of course, be achieved numerically.

For samples in which clusters of nuclei are closely spaced or continuous, or for imaging, other techniques may be used to obtain profile information. Numerous well-known mathematical methods are suitable for analysing the data to produce a distribution consistent with the data. The principle used (as used in other imaging methods) is that the response data obtained for a variety of conditions (e.g. flip angles) are assumed to be the sum of a series of response signals from different amounts of nuclei at different positions. The amounts of nuclei which would give the data observed are then calculated by a known method. Examples of suitable methods include the Maximum Entropy Method (MEM), the Fourier transform, and the Hankel transform. Further discussion of these techniques with specific reference to NQR data may be found in the paper by Robert et al. entitled "On the Reconstruction of NQR Nutation Spectra in Solids with Powder Geometry" in Z.f. Naturforsch. 49a, 35–41 (1994). U.S. Pat. No. 5,229,722 (discussed above) discusses methods of constructing images from NQR investigations and these may be applied to the data obtained with the present invention. Of course, it will be understood that complex rather than simple transforms are appropriate for use with the complex (real and imaginary) data produced by the present invention, but the same mathematical principles apply.

In particular, the method of Rommel, Kimmich et al. discussed above may be employed, with the advantage that the phase information may be used to lessen the effect of interference spikes or other spurious signals. In addition, since two values are obtained simultaneously they are not affected by changes over time of other parameters, so are better correlated and hence may provide better reduction of noise than two values obtained simply by repeating an experiment using amplitude information alone. Thus, the phase information enables a more accurate characterisation to be obtained than by using amplitude information alone.

Although the acquisition methods and apparatus of the invention are quite different to those used in NMR imaging experiments, the resulting data which has phase and amplitude information has similarities. Thus, many well-known NMR image construction techniques may be applied or adapted to the data obtained from an NQR experiment with this invention. An important consideration is that NMR response signals generally have sinusoidal dependence on flip angle, whereas, in the methods of the present invention, the resulting signals generally have Bessel function dependence; thus, where Fourier transforms (series of sinusoids) are employed in NMR data-processing, it will usually be appropriate to use a corresponding Hankel transform (series of Bessel functions), as will be understood by one skilled in the art.

Particularly useful NMR imaging techniques are discussed by Mansfield and Morris in "NMR Imaging in Biomedicine", Nature 242,190 (1973), and other discussion is found in J. Magn. Reson. 33,183 (1979).

In particular, methods for determining the location of nuclei in a sample by NQR may be based on an adaptation of phase-encoding techniques presently used in NMR imaging, but previously thought unworkable in NQR experiments. For example the technique described by Styles in NMR Basic principles and Progress, Vol. 27, pages 49–52 employs a series of pulses in which successive results are summed to generate a maximum signal corresponding to a desired location.

Obtaining Multi-dimensional Information

As mentioned above, the apparatus of the embodiment of FIG. 1B contains 3 orthogonal coils. Thus, to obtain 3-dimensional information about the position of nuclei in a sample, the measurements may be repeated for 3 different directions, and the results combined using known techniques to determine the three dimensional distribution of nuclei in the sample; although the profile information for one direction is obtained according to the invention based on the NQR response of the sample, the resulting profile data may be processed using known techniques generally applicable to processing of profile data obtained by other techniques (e.g. NMR, X-ray CT, ultrasound). It should be noted however that in this particular application, although the profiles obtained from each direction should be substantially independent, in practice some interdependency is observed due in part to divergence of magnetic fields. A similar problem occurs in MRI where surface coils are used, and known techniques for compensating for this in software using wavelet transforms exist. In the Quadrupolar Resonance Imaging of the invention, analogous techniques can be applied, but in this case the correction must take into account the fact that the signal depends on $B_1$ rather than the components of $B_1$ perpendicular to $B_0$. Alternatively, this could be compensated for by obtaining further data from other directions, for example by rotating the probe relative to the sample, or most simply by keeping the size of the sample small in relation to the size of the coils.

Where orthogonal coils are used, excitation and measurement from each direction may be sequential (i.e. excitation and measurement completed for one direction before measurement for another direction is commenced), or may be interleaved.

In variants of the basic technique described above, alternatively or additionally, the sample may be moved with respect to the coil(s). In further variants, a gradient (e.g. a magnetic field gradient) may be imposed upon the sample; this may be used to assist in resolving positional information in one or more directions, or may provide the sole means of resolving information in a particular direction.

As a further alternative, there may be physical movement between the probe and the sample, as discussed above, and this may be used to construct a multi-dimensional (e.g. three-dimensional) image from several profiles obtained at different orientations or positions.

The triangulation method discussed further below may advantageously be employed to improve the measurement of position.

Refinement of Data

It has been mentioned that a variety of pulse lengths or field strengths may be employed to probe different parts of the sample, or to minimise the effect of spurious signals. However, the above discussion has focused on excitation using a pair of pulses of equal duration. Once an approximate distribution has been obtained using the above method, it may be desirable to refine this, by making further measurements. A simple way of improving the accuracy of the measurement is to repeat and average, to reduce the effects of noise and spurious signals. Other techniques which may be employed will be discussed below.

Pulses of Unequal Duration

Pulses of unequal duration may be employed, to provide further analysis of particular regions of interest. From FIG. 14, which is a plot of phase and real and imaginary components against first pulse flip angle for a pair of pulses of constant total duration, it can be seen that at a given total phase shift a particular variation of phase with variation of the first pulse duration is obtained. In that figure, the total pulse length corresponds to a flip angle of $0.7\pi$, the dotted and chain dotted lines are the real and imaginary components, the dashed line is the amplitude, and the phase is indicated by the double chain dotted line. This phase dependence will be different for different total phase shifts (i.e. different positions in the sample), and so nuclei at different positions can be further distinguished by investigating variation of received signal with first pulse angle. It can be seen that for this flip angle (and for flip angles of about $0.8\pi$) the amplitude is substantially constant, but the phase varies significantly as the relative durations are changed.

Another advantage of using pulses of unequal duration is that the pulse lengths can be selected so that a large signal, and hence a large signal-to-noise ratio is obtained, and discrimination achieved by adjusting relative lengths; this may alleviate the problems of increased noise encountered at low flip angles when the lengths of pulses of equal duration are adjusted to obtain several measurements.

Detecting Motion

As discussed above, the phase of the response signal will be a function of position. Thus, if the sample is repeatedly probed, the variation of phase with time will give an indication of motion of the sample. Depending on the f.i.d. time of the sample, real-time determination of motion may be possible. For example, for samples having an f.i.d. of the order of a millisecond, a few hundred determinations may be made every second. Determination of motion may be used to investigate diffusion of quadrupolar nuclei.

Employing Phase Information to Reduce Noise

In another technique, which may be used with a constant or varying field strength throughout the sample, the relative pulse lengths, or total pulse length is changed, and signals of a particular phase are selected. This may be used to reduce the effect of spurious signals, and improve the signal to noise ratio. A technique such as this may be employed in numerous applications in which previously only amplitude information was used.

In a particularly useful embodiment, the excitation is arranged so that a desired signal (that expected to emanate from a substance of interest, if present) has a first predetermined phase, and the excitation repeated so that the desired signal has a different predetermined phase. From the measured phase of the response signal, the desired signal can be more clearly identified, as the phases of other signals will not have changed in the same manner. This may be used either to enhance or reduce the effect of a signal having a particular phase "signature" in the net measurement. Alternatively, by detecting whether or not a predicted phase shift has occurred, this can be used to detect whether a particular distribution of nuclei is present.

Three Pulse Sequences—Refinement of Phase Determination

As described above, two pulses can result in a response signal whose phase and amplitude vary in accordance with the position and number of responsive nuclei in a sample. If a third pulse is applied (preferably substantially contiguous with the first two pulses, or at least before the half-life for decay of the net magnetisation produced by the two pulses), this will have the effect of locking the net magnetisation produced at a particular phase.

It will be appreciated that for the third component to lock the net magnetisation effectively, the direction or phase of the net magnetisation must be known. This may be achieved by transmitting a pair of pulses, obtaining an initial value for the phase of the resulting signal, and transmitting three pulses, the phase of the third pulse being selected according to the initial value. This may enable locking of the net spin, with the benefits of improved signal detection this provides.

The appropriate pulse sequence may be identified, using the above notation (and remembering that the actual flip angle may differ from the nominal angle of 90 degrees) as $(90°)_{0°}$–$(90°)_{90°}$–$(P°)_{Q°}$ where P is the flip angle of the third pulse, typically greater than 90° and having a duration greater than $T_2^*$, and Q is some other angle chosen according to the phase of signals to be locked.

In a further development, the third pulse may be used to determine a more precise value for the phase of the resulting signal. For example, a further value for the phase may be obtained based on the signal resulting after transmission of said three pulses. The further value may be determined on the basis of an error value based on the initial value and a detected signal. If the sample contains nuclei clustered about a single position, for example corresponding to a lump of explosive at a certain depth in the sample, then choice of the phase of the third pulse after determination of the approximate phase of the signal produced by two pulses and subsequent measure of the degree of locking (particularly if repeated for several values) may enable a more accurate determination of the phase and hence depth of the nuclei.

Three Pulse Sequences—Phase Stepping

Alternatively (or additionally), the third pulse may be used to selectively lock components of a particular phase or range of phases. This may be repeated for a series of phases or ranges of phase. In a preferred development, the phase of the third pulse is adjusted (for example in discrete steps e.g. from 0 to $2\pi$, or some subset of this range, or possibly greater) as the excitation is repeated.

Each pulse will lock only signals of a particular phase. By repetitive application of further pulses of the same phase as the third pulse, it may be possible to detect signals limited substantially only to those locked. This can be employed to scan for signals of a particular phase, and may be successfully employed to provide a high degree of phase selectivity.

This may be used to obtain more accurate characterisation of the phase of the received signal, and, where this is correlated to position, the depth of resonant nuclei in the sample. Particularly where phase varies with position, this technique may be used to obtain series of data, each corresponding to the signal obtained from different positions within a sample. In other words, the third pulse may be used to select slices of interest. This may be particularly useful in imaging experiments. In addition, it may be useful in reducing spurious signals, since signals emanating from a region of interest can be effectively isolated from other signals. Selection of phase may be useful also in noise suppression as mentioned above.

The number and size of the steps in the phase of the third pulse will be adjusted according to the size of the object and the desired resolution, and on the time available for measurement.

As is well known, the duration of a pulse and the precision at which its phase and frequency can be determined are related; greater phase or frequency accuracy requires longer pulses, and this must be taken into account, particularly if a large number of small steps are attempted. In addition, it may be difficult to achieve precise control of small phase shifts using a conventional frequency generator and phase shifter. Thus, if intricate phase control is required, it is preferred to synthesise excitation waveforms, for example using a digital memory and fast digital to analogue converter.

The phase steps need not be uniform, and, particularly where the phase of the received signal is not linearly related to distance from the probe (which will be true for many arrangements of magnetic field coils), it may be desirable for the size of the phase steps to vary. For example, the phase steps may be arranged so that each corresponds to a substantially constant step in distance.

Determination of Molecular Environments

The response of quadrupolar nuclei in a sample may be affected by interactions with other nuclei in the local environment. Some of these interactions may happen over a timescale substantially longer than the Free-induction-decay period of the nuclei, in which case they will not readily be observed. However, if a third, locking, pulse is used to lock the magnetisation produced by the first two pulses for a time comparable to the period over which the interactions occur, then the interactions may be observed. In particular, some interactions may result in slight deviations in frequency. Closely spaced frequencies are often difficult to resolve by conventional methods, such as Fourier transforming the sampled data. It has been appreciated that the phase of signals that are slightly off resonance will change with time. Thus by applying a third pulse to lock the magnetisation for a time comparable to the timescale of the interaction and then measuring the phase of the resulting signal, similar frequencies can be distinguished.

By repeating the measurements for a variety of locking pulse phases or durations, characteristic frequencies of molecular interactions may be identified. The phase of the third pulse may be used to assist in measurement of the phase of the response signal. Although the third pulse will usually be substantially contiguous with the first two, it may be transmitted after a delay (preferably less than the time for the magnetisation induced by the first two pulses to decay); this may be used to observe how the phase evolves in the absence of a locking pulse.

For substances with long Free-induction decay times, interactions may be observed without locking the magnetisation, but simply by applying a third, read, pulse to determine the phase of the response signal after a predetermined time; this will produce an echo pulse from which the phase can be determined.

Echoes

The phase and amplitude information need not be measured directly, but may be measured by applying a sequence of (composite) pulses to excite echo responses, for example based on the techniques taught in BTG's earlier International Patent Application Number WO 93/11441. This may be particularly useful in detection of biological $^{14}$N, where the observed spectra are broad, and $T_2^*$ is short. A phase parameter may be determined from one or more echo response signals. The phase of subsequent echo signals may differ slightly, particularly where the frequency is slightly off resonance, in which case the phase will precess at a rate dependent on how far off resonance the excitation is. This may be used to investigate small frequency offsets, or to investigate molecular interactions occurring on a timescale comparable to the timescale over which echoes can be measured.

Variation of Temperature, Pressure, or Other Parameters

As is well known, changing temperature and pressure tends to alter the resonant frequency of a species; subjecting the species to a static magnetic field tends to alter the frequency and broaden the response for integral spin quadrupolar nuclei such as $^{14}$N, or to produce a broadening and/or splitting of the line (in the response spectrum) for half-integral spin quadrupolar nuclei such as $^{35}$Cl. Shifts in temperature and pressure can thus be determined by altering the frequency of measurement or by measuring the resonant frequency, and this combined with positional determination can be used for stress or thermal characterisation. Conversely, if the sample is subjected to a known gradient, the measurements will depend on position in a known manner, and this can be used to provide further positional information. Shifts in frequency or splitting of a spectral line into different components due to a magnetic field may also be used to measure the field; this may be useful in analytical applications in which the sample may contain ferromagnetic contaminants.

Preparation Pulses

Prior to sampling, one or more pulses (at frequencies other than the measurement frequency) may be applied to the sample to alter the population of nuclei in different excited states. The intensity of the response signal is proportional to the difference in populations in each state, so if this difference is increased, the response signal will be correspondingly stronger. For example, if a pulse having a frequency corresponding to a transition from the first excited state to the second excited state is applied, the population of nuclei in the first state will be reduced and the population in the second state increased. Subsequent measurement at a frequency corresponding to a transition from the ground state to the first state will excite a stronger response as there will be a greater number of vacancies in the first state.

In addition, since the measurement will be dependent on the response to two characteristic frequencies, this may provide better discrimination of similar species; the probability of a species other than the desired species absorbing the preparation pulse and responding to the measurement pulse(s) is lower than that of it responding to the measurement pulse alone.

Adjusting Bandwidth

As is well known, the bandwidth of a signal is inversely proportional to its duration; a long pulse (or "selective"

pulse) has a better defined frequency than a short pulse. Within limits, the field strength can be adjusted so that a pulse length appropriate to the desired bandwidth may be used. For example, if it is desired to use an exciting pulse having a precisely defined frequency, a long pulse and a low field strength may be employed to produce a particular flip angle. To excite a broader range of frequencies, a short high intensity pulse would be used; this may be useful in exciting samples having a spread of resonant frequencies.

Off-resonance Experiments

An effect of moving to off-resonant conditions is that the magnitude of the response signal can vary according to the frequency offset. This may need to be compensated for by careful manipulation of the received signal, or by the use of excitation at a plurality of discrete frequencies, as taught in International Patent Publication No. WO 92/17794.

Another effect of moving to off-resonant conditions is that the response signal intensity can depend upon whether the frequency offset is positive or negative, more intense signals sometimes being found with, say, a positive frequency offset. This effect may need to be compensated for by skewing the excitation frequency or frequencies to frequencies somewhat lower than the central frequency of the frequency range of interest.

A pair of pulses of the same carrier frequency but different phase can produce an effective frequency shift from the carrier frequency (this can be understood by considering the fourier transform of the waveform), the direction of the frequency shift being dependent on the phase change. Thus, for example, a +90 degree shift may result in a positive frequency shift, whereas a −90 degree (+270) shift may result in a negative frequency shift. The response signals will therefore differ depending on the direction of the phase shift, and this may be used to provide further characterisation of the sample. Conversely, a response similar to that excitable by two pulses of equal frequency but different phase may be excited by using two pulses of different frequency; this provides a further method of exciting a desired response signal.

Figure 15:
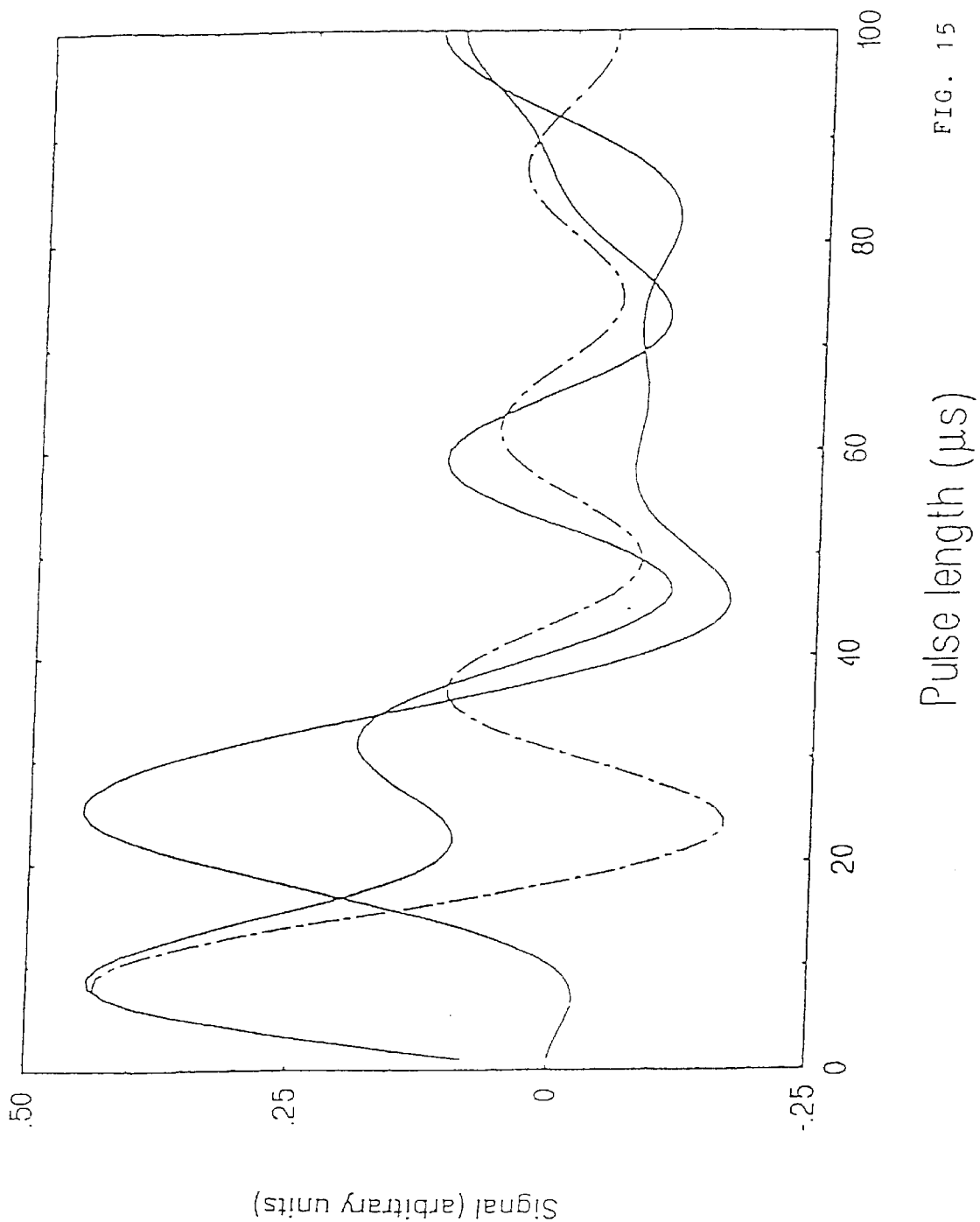
FIG. 15 is a plot showing variation of real and imaginary components with pulse length for off-resonance excitation with a single pulse, and variation of amplitude with pulse length for on-resonance excitation.

Since the phase of the received signal will change at off-resonance conditions, this may be employed to improve determination of the exact resonant frequency. FIG. 15 shows how the real and imaginary components (solid lines) vary as a function of pulse length in response to a single r.f. excitation pulse (of strength equivalent to 40 kHz) at 4 kHz off resonance (10% of pulse strength), the dashed curve showing how the magnitude of the signal on resonance is expected to vary. The magnitude of the signal off resonance will exceed that of the on-resonance signal for most pulse lengths. The off resonance behaviour clearly exhibits independent variation in the real and imaginary components as the pulse length is varied, which can be observed as a corresponding variation in phase.

By suitable choice of off-resonance excitation, the response signal may be selected to have a particular phase, and this may provide a further method of exciting the sample. This may be useful for distinguishing genuine NQR responses from spurious signals. A gradient, such as a temperature gradient, which affects the resonance frequency will affect the extent to which the excitation is off resonance, and hence the phase of the signal; this may be used to provide further characterisation of the sample.

Triangulation

In another arrangement (not illustrated), at least two, and preferably three or more coils are located around the sample. Unlike the above described embodiment of FIG. 1B, the coils are not necessarily orthogonal, but generally disposed so that the axes of any two coils subtend an angle, preferably within a range of about 30–150 degrees in the vicinity of the sample.

In a preferred version of this arrangement, two or more (most advantageously three) receiver coils are used to detect the signal produced in response to a spatially varying field produced by a (separate) transmitter coil arrangement. The phase of the signal received by each coil resulting from an NQR response from a given cluster of nuclei would be expected to be substantially the same for each receiver coil (phase changes due to different propagation distances would be negligible, unless the distances are large or the frequency very high). However, the amplitude would be expected to vary as a function of distance (typically according to an inverse cube law) from the cluster to each coil. Thus, by comparing the amplitudes of signals of like phase detected by each receiver coil, an indication of the relative distances from the receiver coils may be obtained. The phase itself may be used to give an indication of the distance from the transmitter coil as described above. By triangulation (that is by solving for the position of the nuclei based on the distances from each reference point), positional information, such as the position in space of the cluster may be determined.

This determination of position may be compared to or otherwise combined with an estimate of position determined by other methods, such as based on the phase of the signal as discussed above. In particular, the phase information may give an indication of distance from the transmitter coil as discussed above. Thus, with two receiver coils, and one transmitter coil arrangement, three distances may be determined, which may be used to determine the position of a cluster of responsive nuclei uniquely. If more coils are used, an indication of the accuracy of the measurement may be made. It will be apparent that this information may be used in production of an image of the sample.

It will be understood that whilst the above method is particularly preferable, an indication of distance may be obtained simply by measuring the received signal amplitude in response to a single pulse, and thus the position of responsive nuclei may be determined without using the phase information which the first aspect of the invention makes available.

It will be understood that the present invention has been described above purely by way of example, and modifications of detail can be made within the scope of the invention.

Each feature disclosed in the description, and (where appropriate) the claims and drawings may be provided independently or in any appropriate combination. The abstract is incorporated herein by reference.

What is claimed is:

1. A method of nuclear quadrupole resonance testing a sample containing quadrupolar nuclei, said method comprising:

applying excitation to said sample, said excitation being arranged to produce a response signal containing detectable, substantially independently varying phase and amplitude dependent components resulting from nuclear quadrupole resonance interaction between said excitation and said quadrupolar nuclei, detecting said response signal, resolving said response signal into phase and amplitude dependent components, and processing said response signal on the basis that both of said components vary substantially independently.

2. A method according to claim 1, wherein a plurality of values of said response signal are sampled, said response signal having a phase and an amplitude, and a plurality of values of a phase parameter varying as a function of said phase of said response signal substantially independently of said response signal amplitude are determined.

3. A method according to claim 1, wherein said excitation comprises first and second pulses differing in phase by a predetermined angle.

4. A method according to claim 3, wherein said predetermined angle is about 90 degrees.

5. A method according to claim 3, wherein said pulses are substantially contiguous.

6. A method according to claim 3, wherein said pulses are of substantially equal duration.

7. A method according to claim 3, wherein said excitation includes a third pulse arranged to produce an echo from said response to said first and second pulses.

8. A method according to claim 1, wherein said phase and amplitude dependent components comprise two components having a quadrature phase relationship to each other.

9. A method according to claim 8, wherein a parameter varying as a function of phase is obtained from a ratio of said two components.

10. A method according to claim 1, wherein said excitation has a field strength, wherein said field strength varies throughout at least a portion of said sample according to a given pattern.

11. A method according to claim 10, wherein said excitation has an excitation pulse duration, wherein said field strength and said excitation pulse duration are selected to produce flip angles within a range of 0 to 360 degrees throughout a region of interest of said sample.

12. A method according to claim 1, wherein a positional parameter of said nuclei is obtained based on at least said phase of said response signal.

13. A method according to claim 12 comprising applying said excitation repeatedly to said sample, and repeating said analysing to obtain a plurality of sets of said profile information.

14. A method according to claim 13,
wherein at least one further set of profile information of at least one of higher resolution and signal-to-noise ratio is obtained from said plurality of sets, and
wherein at least one factor affecting said NQR response is varied as said excitation is repeated,
said at least one factor comprising at least one of excitation pulse duration and excitation field strength.

15. A method according to claim 13,
wherein at least one further set of profile information of at least one of higher resolution and signal-to-noise ratio is obtained from said plurality of sets, and
wherein at least one factor affecting said NQR response is varied as said excitation is repeated,
said excitation comprising first and second pulses, the relative duration of said pulse varying but total duration of said pulses remaining substantially constant as said excitation is repeated.

16. A method according to claim 14, comprising obtaining a plurality of sets of profile information, corresponding to profiles at different positions or in different directions.

17. A method according to claim 12, wherein said positional parameter is a measure of position of said nuclei in a predetermined reference frame.

18. A method according to claim 1, wherein quantity information representative of an amount of said nuclei is obtained based on at least said amplitude of said response signal.

19. A method according to claim 1 including analysing said components to obtain profile information representative of a distribution of said nuclei in said sample.

20. A method according to claim 19, wherein excitation is applied from two or more directions and said profile information is obtained for each direction.

21. A method according to claim 19 for forming an image of said sample, further comprising constructing an image of said sample from said at least one set of profile information.

22. A method according to claim 1, wherein distances of a cluster of said quadrupolar nuclei from at least two reference points are determined, and wherein positional information of said cluster is calculated based on respective ones of said distances.

23. A method according to claim 1 including analysing said components to obtain profile information representative of variation of an environmental parameter which affects said NQR response in said sample.

24. A method of forming an image of a sample containing quadrupolar nuclei, said method comprising:
applying excitation to said sample,
said excitation having a field strength varying according to a given function of position and being arranged to produce a detectable response signal resulting from NQR interaction between said excitation and said quadrupolar nuclei,
said response signal being resolvable into phase-dependent and amplitude-dependent components,
resolving said response signal into two received components representative of said phase-dependent and amplitude-dependent components, and
based on substantially independent variation of both received components, producing an image representative of at least one of distribution and environment of said nuclei in said sample.

25. A method according to claim 24, wherein said excitation is repeated a plurality of times and at least one of excitation pulse amplitude and excitation pulse duration is varied as said excitation is repeated.

26. A method according to claim 24, further comprising producing a visual output of said image.

27. A method according to claim 24, wherein forming an image includes obtaining a measure of correlation between predicted results based on a model of said sample to data obtained from said sample.

28. A method according to claim 27, including predicting results for a series of model configurations and selecting a model configuration producing best correlation to data obtained from said sample as representative of said sample.

29. A method according to claim 24, wherein forming an image includes obtaining a series of time domain data for different excitation pulse lengths, fourier transforming said data to produce frequency domain data, and fourier transforming said frequency domain data with respect to a function of pulse length to produce profile data varying with a function of distance.

30. A method according to claim 29, further comprising processing said profile data to produce profile data varying with distance.

31. A method according to claim 24, further comprising adjusting a scale factor based on results of a calibration experiment with a sample of known properties.

32. A method of probing a sample to detect quadrupolar nuclei therein, said method comprising
applying excitation to said sample,
said excitation being arranged to produce a response signal having detectable phase and amplitude components resulting from NQR interactions with said quadrupolar nuclei, detecting said response signal and resolving detected signal into resolved phase-dependent and amplitude-dependent components, obtaining a phase parameter from said resolved components, and processing both resolved components using said phase parameter to produce an output having a signal-to-noise ratio greater than that of said response signal amplitude.

33. A method according to claim 32, wherein said processing includes applying a first excitation to produce a first received signal in which a desired signal has a first phase dependence, and applying a second excitation to produce a second received signal in which said desired signal has a second phase dependence, and detecting said desired signal on the basis of said first and second received signals and corresponding measured phase dependence thereof.

34. Apparatus for detecting an NQR response in a sample containing quadrupolar nuclei, the apparatus comprising:

excitation means arranged to generate an excitation signal capable of exciting an NQR response having detectable phase and amplitude components;

transmission means arranged to transmit said excitation signal to said sample;

detection means arranged to detect a response signal generated by said sample to produce a detected signal;

resolving means arranged to resolve said detected signal into first and second components; and signal processing means coupled to said resolving means to receive both said first and second components and arranged to process said response signal based on substantially independent variation of both phase-dependent and amplitude-dependent components thereof.

35. Apparatus according to claim 34, wherein the excitation means is arranged to generate at least two pulses differing in phase by a predetermined angle.

36. Apparatus according to claim 34, wherein said transmission means is arranged to generate a field having a field strength varying according to a given pattern throughout at least a portion of said sample.

37. Apparatus according to claim 36, further comprising control means arranged to cause said transmission means to generate a plurality of said given patterns.

38. Apparatus according to claim 36, wherein said transmission means comprises at least first and second coils for producing respectively, on excitation with an electrical signal, at least first and second fields varying in strength as different functions of position in a vicinity of said sample, wherein adjustment of relative amplitudes of electrical signal supplied to each coil alters said pattern of net field.

39. Apparatus according to claim 38, wherein said transmission means includes a coil for generating a field having a substantially constant field strength in said vicinity of said sample.

40. Apparatus according to claim 34, having means to store or to calculate the or each given pattern to provide an estimate of transmitted field strength at a plurality of positions, and having weighting means for determining an adjusted value of received signal strength based on said received signal strength and said estimated field strength at a position in said sample corresponding to a source of said received signal.

41. Apparatus according to claim 34, wherein said resolving means is arranged to resolve said received signal into components having a quadrature relationship.

42. Apparatus according to claim 34, wherein said signal-processing means includes or is coupled to processing means arranged to process said components to obtain data representative of at least one of distribution and environment of said nuclei in said sample.

43. Apparatus according to claim 42, wherein said processing means is arranged to construct an image of the sample.

44. Apparatus according to claim 43, wherein said processing means includes means for producing a visual output of said image.

45. Apparatus according to claim 44, further comprising means for causing a variation in at least one environmental parameter which affects said NQR response throughout at least a portion of said sample.

46. Apparatus according to claim 34, wherein said signal processing means is arranged to sample said detected signal for a predetermined time, and to store two components which together contain both phase and amplitude information.

* * * * *